United States Patent
Makinen et al.

(10) Patent No.: US 8,766,933 B2
(45) Date of Patent: Jul. 1, 2014

(54) TACTILE STIMULATION APPARATUS HAVING A COMPOSITE SECTION COMPRISING A SEMICONDUCTING MATERIAL

(75) Inventors: Ville Makinen, Espoo (FI); Jukka Linjama, Espoo (FI); Zohaib Gulzar, Karachi (PK)

(73) Assignee: Senseg Ltd., Espoo (FI)

( * ) Notice: Subject to any disclaimer, the term of this patent is extended or adjusted under 35 U.S.C. 154(b) by 364 days.

(21) Appl. No.: 12/900,305

(22) Filed: Oct. 7, 2010

(65) Prior Publication Data

US 2011/0109588 A1 May 12, 2011

Related U.S. Application Data

(63) Continuation-in-part of application No. 12/793,563, filed on Jun. 3, 2010.

(60) Provisional application No. 61/260,554, filed on Nov. 12, 2009.

(51) Int. Cl.
*G06F 3/041* (2006.01)
*G06F 3/01* (2006.01)

(52) U.S. Cl.
USPC .......................................... 345/173; 715/702

(58) Field of Classification Search
USPC ..................... 345/173; 178/18.06; 715/702
See application file for complete search history.

(56) References Cited

U.S. PATENT DOCUMENTS

| | | | |
|---|---|---|---|
| 3,267,931 A | 8/1966 | Phuarich et al. | |
| 4,210,905 A | 7/1980 | Coons | |
| 4,429,413 A * | 1/1984 | Edwards | 382/124 |
| 5,436,565 A | 7/1995 | Gammell | |
| 5,929,573 A | 7/1999 | Louwers et al. | |
| 5,933,102 A * | 8/1999 | Miller et al. | 341/33 |
| 6,154,188 A | 11/2000 | Learn et al. | |
| 6,175,767 B1 | 1/2001 | Doyle, Sr. | |
| 6,369,806 B1 | 4/2002 | Endo et al. | |
| 6,815,657 B2 | 11/2004 | Toyoshima et al. | |
| 7,019,623 B2 | 3/2006 | Klausner et al. | |
| 7,124,041 B1 | 10/2006 | Johnson et al. | |
| 7,321,311 B2 | 1/2008 | Reith et al. | |

(Continued)

FOREIGN PATENT DOCUMENTS

| CN | 102741788 A | 10/2012 |
|---|---|---|
| EP | 1731993 A1 | 12/2006 |

(Continued)

OTHER PUBLICATIONS

"U.S. Appl. No. 12/232,536, Non Final Office Action mailed Dec. 14, 2010", 7 pgs.

(Continued)

*Primary Examiner* — Kevin M Nguyen
(74) *Attorney, Agent, or Firm* — Schwegman, Lundberg & Woessner, P.A.

(57) ABSTRACT

Embodiments of tactile stimulation apparatuses and components of such apparatuses are generally described herein. For example, in one embodiment, a tactile stimulation apparatus is provided. This tactile stimulation apparatus has a composite section comprising an insulation region and a semiconducting region that is proximate to the insulation region. This insulation region is touchable by a body member. Additionally included is a voltage source proximate to the semiconducting region. Here, the voltage source is configured to charge the semiconducting region to an electric potential, which produces an electrosensory sensation on the body member.

20 Claims, 17 Drawing Sheets

(56) References Cited

U.S. PATENT DOCUMENTS

| | | | |
|---|---|---|---|
| 7,418,108 | B2 | 8/2008 | Oser |
| 7,520,365 | B2 | 4/2009 | Fukuba et al. |
| 7,924,144 | B2 | 4/2011 | Makinen et al. |
| 7,982,588 | B2 | 7/2011 | Makinen et al. |
| 8,026,798 | B2 | 9/2011 | Makinen et al. |
| 8,174,373 | B2 | 5/2012 | Makinen et al. |
| 8,570,163 | B2 | 10/2013 | Makinen et al. |
| 2002/0093491 | A1 | 7/2002 | Gillespie et al. |
| 2003/0025721 | A1 | 2/2003 | Clapper et al. |
| 2003/0067449 | A1 | 4/2003 | Yoshikawa et al. |
| 2003/0213624 | A1 | 11/2003 | Cross et al. |
| 2004/0095330 | A1 | 5/2004 | Ling et al. |
| 2004/0104887 | A1 | 6/2004 | Tsukamoto et al. |
| 2004/0125079 | A1 | 7/2004 | Kaneko et al. |
| 2004/0150277 | A1 | 8/2004 | Moriyasu |
| 2004/0164971 | A1 | 8/2004 | Hayward et al. |
| 2004/0189617 | A1 | 9/2004 | Gerpheide et al. |
| 2004/0192423 | A1 | 9/2004 | Nevermann |
| 2004/0220485 | A1 | 11/2004 | Rytky |
| 2005/0030166 | A1 | 2/2005 | Kraus et al. |
| 2005/0041018 | A1 | 2/2005 | Philipp |
| 2005/0057528 | A1 | 3/2005 | Kleen |
| 2006/0033722 | A1 | 2/2006 | Chiu et al. |
| 2006/0046031 | A1 | 3/2006 | Janevski |
| 2006/0066588 | A1 | 3/2006 | Lyon et al. |
| 2006/0119585 | A1 | 6/2006 | Skinner |
| 2006/0250354 | A1 | 11/2006 | Takata et al. |
| 2006/0274048 | A1* | 12/2006 | Spath et al. ............. 345/173 |
| 2006/0279537 | A1 | 12/2006 | Kim et al. |
| 2008/0143683 | A1* | 6/2008 | Hotelling ............... 345/173 |
| 2008/0143693 | A1 | 6/2008 | Schena |
| 2008/0158172 | A1 | 7/2008 | Hotelling et al. |
| 2008/0158183 | A1 | 7/2008 | Hotelling et al. |
| 2008/0162997 | A1 | 7/2008 | Vu et al. |
| 2008/0174415 | A1 | 7/2008 | Tanida et al. |
| 2008/0251364 | A1 | 10/2008 | Takala et al. |
| 2009/0002328 | A1* | 1/2009 | Ullrich et al. ............. 345/173 |
| 2009/0079550 | A1 | 3/2009 | Makinen et al. |
| 2009/0102805 | A1 | 4/2009 | Meijer et al. |
| 2009/0109007 | A1 | 4/2009 | Makinen et al. |
| 2009/0128374 | A1 | 5/2009 | Reynolds et al. |
| 2009/0174671 | A1 | 7/2009 | Tachi et al. |
| 2010/0044120 | A1 | 2/2010 | Richter |
| 2010/0085169 | A1* | 4/2010 | Poupyrev et al. ............. 345/174 |
| 2010/0188364 | A1 | 7/2010 | Lin et al. |
| 2010/0231508 | A1 | 9/2010 | Cruz-hernandez et al. |
| 2010/0231540 | A1 | 9/2010 | Cruz-hernandez et al. |
| 2010/0259503 | A1 | 10/2010 | Yanase et al. |
| 2010/0283762 | A1 | 11/2010 | Takusa |
| 2011/0012845 | A1 | 1/2011 | Rothkopf et al. |
| 2011/0074733 | A1 | 3/2011 | Mäkinen et al. |
| 2011/0109584 | A1 | 5/2011 | Linjama et al. |
| 2011/0187516 | A1 | 8/2011 | Makinen et al. |
| 2011/0254799 | A1 | 10/2011 | Makinen et al. |
| 2012/0242463 | A1 | 9/2012 | Makinen et al. |

FOREIGN PATENT DOCUMENTS

| | | |
|---|---|---|
| EP | 1939712 A1 | 7/2008 |
| FI | 20080213 | 11/2008 |
| JP | 3543097 B2 | 7/2004 |
| TW | 201140397 A | 11/2011 |
| WO | WO-02073587 | 9/2002 |
| WO | WO-02073587 A1 | 9/2002 |
| WO | WO-2004051451 A2 | 6/2004 |
| WO | WO-2007111909 A2 | 10/2007 |
| WO | WO-2009037379 | 3/2009 |
| WO | WO-2009141502 A1 | 11/2009 |
| WO | WO-2010037894 A1 | 4/2010 |
| WO | WO-2011058225 A1 | 5/2011 |

OTHER PUBLICATIONS

"U.S. Appl. No. 12/232,536, Notice of Allowance mailed Feb. 22, 2011", 5 pgs.

"U.S. Appl. No. 12/232,548, Non Final Office Action mailed Jan. 7, 2011", 10 pgs.

"U.S. Appl. No. 12/232,548, Preliminary Amendment filed Sep. 18, 2008".

"U.S. Appl. No. 12/232,548, Response filed Apr. 4, 2011 to Non-Final Office Action Received Jan. 7, 2011", 12 pgs.

"U.S. Appl. No. 12/232,548, Supplemental Preliminary Amendment filed Sep. 6, 2010", 5 pgs.

"U.S. Appl. No. 12/232,536. Response filed Feb. 8, 2011 to Non Final Office Action mailed Dec. 14, 2010", 9 pgs.

"U.S. Appl. No. 12/993,784, Preliminary Amendment filed Nov. 19, 2010", 9 pgs.

"U.S. Appl. No. 12/993,784, Supplemental Preliminary Amendment filed Dec. 7, 2010", 4 pgs.

"U.S. Appl. No. 13/122,113, Preliminary Amendment filed Mar. 31, 2011", 7 pgs.

"International Application Serial No. PCT/FI2008/050550, PCT Search Report mailed Jun. 12, 2009", 3 pgs.

Agarwal, A. K, et al., "A hybrid natural/artificial electrostatic actuator for tactile stimulation", 2nd Annual International IEEE-EMB Special Topic Conference on Microtechnologies in Medicine & Biology, Abstract; sections II.A, II.B and III.A; figures 1-2, (2002), 341-345.

Fukumoto, M., et al., "Active Click: Tactile Feedback for Touch Panels", New York: ACM, ISBN 1-58113-340-5, Whole document, (2001), 121-122.

Gunther, "Skinscape: A Tool for Composition in the Tactile Modality", Massachusetts Institute of Technology, (2001), 1-118.

Kaczmarek, K. A, et al., "Electrotactile and vibrotactile displays for sensory substitution systems", IEEE Transactions on Biomedical Engineering, 38(1), (Jan. 1991), 1-16.

Kajimoto, H, et al., "Electro-Tactile Display with Tactile Primary Color Approach", Proceedings of International Conference on Intelligent Robots and Systems, (2004), 10 pgs.

Kajimoto, H., et al., "Psychophysical evaluation of receptor selectivity in electro-tactile display", 13th International Symposium on Measurement and Control in Robotics (ISMCR), Madrid, Spain, http://files.tachilab.org/intconf2000/kajimoto200312ISMCR.pdf, (2003), 4 pgs.

Kajimoto, H., et al., "Tactile Feeling Display using Functional Electrical Stimulation", 9th International Conference on Artificial Reality and Tele-Existence (ICAT'99), Tokyo, Japan; [online] Accessed from http://files.tachilab.org/intconf1900/kajimoto1999ICAT.pdf,, (1999), 8 pgs.

Kuroki, S., et al., "Proposal for tactile sense presentation that combines electrical and mechanical stimulus", Second Joint EuroHaptics Conference, 2007 and Symposium on Haptic Interfaces for Virtual Environment and Teleoperator Systems. World Haptics 2007., (2007), 121-126.

Pfeiffer, E. A, "Electrical stimulation of sensory nerves with skin electrodes for research, diagnosis, communication and behavioral conditioning: a survey", Med Biol Eng., 6(6), (Nov. 1968), 637-51.

Poupyrev, I., et al., "Ambient touch: designing tactile interfaces for handheld devices", UIST '02 Proceedings of the 15th annual ACM symposium on User interface software and technology, XP 001171567, abstract; section 'TouchEngine display', (2002), 51-60.

Reilly, J. P, et al., "Electrocutaneous Stimulation with High Voltage Capacitive Discharges", IEEE Transactions on Biomedical Engineering, vol. BME-30 , Issue: 10, (1983), 631-641.

Rekimoto, J, et al., "SmartSkin: An Infrastructure for Freehand Manipulation on Interactive Surfaces.", CHI '02 Proceedings of the SIGCHI conference on Human factors in computing systems: Changing our world, changing ourselves, XP 001099406, abstract; figure 2; section 'SmartSkin sensor architecture'; firgures 12-14; sections 'Interactions by using fingers and hand gestures' and 'Combination with tactile feedback', (2002), 113-120.

Tang, H., et al., "A Microfabricated Electrostatic Haptic Display for Persons with Visual Impairments", IEEE Transactions on Rehabilitation Engineering, ISSN 1063-6528, vol. 6, No. 3,, XP 011053920, abstract; Figure 1; sections II.A, II.B and II.D, (Sep. 1998), 241-248.

Beebe, David J., et al., "A Polyimide-on-silicon Electrostatic Fingertip Tactile Display", IEEE-EMBC and CMBEC, IEEE 17th Annual Conference, Sep. 20-23, 1995 vol. 2, (1995), 1545-1546.

(56) References Cited

OTHER PUBLICATIONS

Kaczmarek, Kurt A., et al., "Polarity Effect in Electrovibration for Tactile Display", IEEE Transactions on Biomedical Engineering, vol. 53, No. 10, (Oct. 2006), 2047-2054.

Linjama, Jukka, et al., "E-Sense screen: Novel haptic display with Capacitive Electrosensory Interface", Demo paper Submitted for HAID 09, 4thWorkshop for Haptic and Audio Interaction Design, Dresden, Germany, (Sep. 10-11, 2009), 1-2.

Yamamoto, Akio, et al., "Electrostatic Tactile Display with Thin Film Slider and Its Application to Tactile Telepresentation Systems", IEEE Transactions on Visualization and Computer Graphics, vol. 12, No. 2, (Mar./Apr. 2006), 168-177.

"International Application Serial No. PCT/FI2010/050902, International Search Report mailed May 6, 2011", 4 pgs.

"International Application Serial No. PCT/FI2010/050902, Written Opinion mailed May 6, 2011", 6 pgs.

"U.S. Appl. No. 12/232,548, Notice of Allowance mailed Jun. 2, 2011", 5 pgs.

"U.S. Appl. No. 12/793,563, Non Final Office Action mailed Nov. 13, 2012", 16 pgs.

"U.S. Appl. No. 12/793,563, Response filed Sep. 10, 2012 to Restriction Requirement filed Aug. 10, 2012", 8 pgs.

"U.S. Appl. No. 12/793,563, Restriction Requirement mailed Aug. 10, 2012", 5 pgs.

"U.S. Appl. No. 12/993,784, Non Final Office Action mailed Nov. 8, 2012", 23 pgs.

"U.S. Appl. No. 13/122,113, Notice of Allowance mailed Jun. 20, 2011", 11 pgs.

"U.S. Appl. No. 13/171,078, Non Final Office Action mailed Nov. 17, 2011", 8 pgs.

"U.S. Appl. No. 13/171,078, Notice of Allowance mailed Mar. 16, 2012", 5 pgs.

"U.S. Appl. No. 13/171,078, Response filed Feb. 6, 2012 to Non Final Office Action mailed Nov. 17, 2011", 10 pgs.

"U.S. Appl. No. 13/432,329, Final Office Action mailed Jan. 8, 2013", 9 pgs.

"U.S. Appl. No. 13/432,329, Non Final Office Action mailed Aug. 8, 2012", 7 pgs.

"U.S. Appl. No. 13/432,329, Response filed Nov. 7, 2012 to Non Final Office Action mailed Aug. 8, 2012", 10 pgs.

"International Application Serial No. PCT/FI2010/050902, International Preliminary Report mailed Apr. 25, 2012", 24 pg.

"International Application Serial No. PCT/FI2010/050902, Written Opinion mailed Feb. 2, 2012", 7 pgs.

"International Application Serial No. PCT/FI2010/050902, Written Opinion Response filed Mar. 16, 2012", 11 pgs.

Mallinckrodt, Edward, et al., "Perception by the Skin of Electrically Induced Vibrations", Science, 4, (1953), 277-278.

Strong, Robert M, et al., "An Electrotactile Display", IEEE Transactions on Man-Machine Systems, 11(1), (1970), 72-79.

U.S. Appl. No. 12/793,563 , Response filed Mar. 11, 2013 to Non Final Office Action mailed Nov. 13, 2012, 15 pgs.

U.S. Appl. No. 12/793,563, Non Final Office Action mailed Apr. 12, 2013, 17 pgs.

U.S. Appl. No. 12/993,784, Response filed Mar. 8, 2013 to Non Final Office Action mailed Nov. 8, 2012, 20 pgs.

U.S. Appl. No. 13/432,329, Notice of Allowance mailed Apr. 2, 2013, 6 pgs.

U.S. Appl. No. 13/432,329, Notice of Allowance mailed Jul. 1, 2013, 6 pgs.

U.S. Appl. No. 13/432,329, Response filed Mar. 8, 2013 to Final Office Action mailed Jan. 8, 2013, 9 pgs.

U.S. Appl. No. 12/793,563, Final Office Action mailed Sep. 20, 2013, 18 pgs.

U.S. Appl. No. 12/793,563, Response to Non Final Office Action mailed Apr. 12, 2013, 17 pgs.

U.S. Appl. No. 12/993,784, Final Office Action mailed Nov. 26, 2013, 25 pgs.

\* cited by examiner

TACTILE STIMULATION APPARATUS HAVING A COMPOSITE SECTION COMPRISING A SEMICONDUCTING MATERIAL

CROSS-REFERENCES TO RELATED APPLICATIONS

This application is a continuation-in-part of U.S. application Ser. No. 12/793,563, entitled "Tactile Stimulation Apparatus Having a Composite Section Comprising a Semiconducting Material," filed Jun. 3, 2010, which claims the benefit of U.S. Provisional Application No. 61/260,554, entitled "Interface Apparatus for Touch Input," filed Nov. 12, 2009, the disclosures of which are incorporated herein in its entirety by reference.

BACKGROUND

An electrical shock may occur when electricity suddenly flows through a part of the body, typically causing the stimulation of the nerves. For example, a user may experience an electric shock upon touching a particular component of a computer or other device if that component is leaking current or is not sufficiently insulated. Additionally, some insulation materials used to cover components of a device for preventing electric shock or for other purposes may be very thick. The thickness of an insulation material contributes to the bulk of the component, thereby adding to the bulk of the device having the insulated component.

BRIEF DESCRIPTION OF DRAWINGS

The present disclosure is illustrated by way of example and not limitation in the figures of the accompanying drawings, in which like references indicate similar elements and in which.

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. Embodiments of the invention set forth in the claims encompass all available equivalents of those claims. Embodiments of the invention may be referred to, individually or collectively, herein by the term "invention" merely for convenience and without intending to limit the scope of this application to any single invention or inventive concept if more than one is in fact disclosed.

Embodiments as discussed herein provide the use of a semiconducting material in a tactile stimulation apparatus to possibly suppress or prevent electrical shock or for other functionalities. With a tactile stimulation apparatus, a user can feel a sensation of touch, pressure, or vibration from touching a particular section of the tactile stimulation apparatus (e.g., a surface of the apparatus). This section comprises an insulation material, such as glass. In an embodiment, a semiconducting material is layered or integrated with the insulation material. For example, a thin layer of a semiconducting material can be deposited on a piece of glass that comprises a section of the tactile stimulation apparatus. As described in more detail by way of example below, this semiconducting material may possibly limit the amount current flow, thereby suppressing or preventing electrical shock to the user. Additionally, as also described in more detail by way of example below, the semiconducting material may possibly reduce the thickness of the insulation material.

Figure 1:
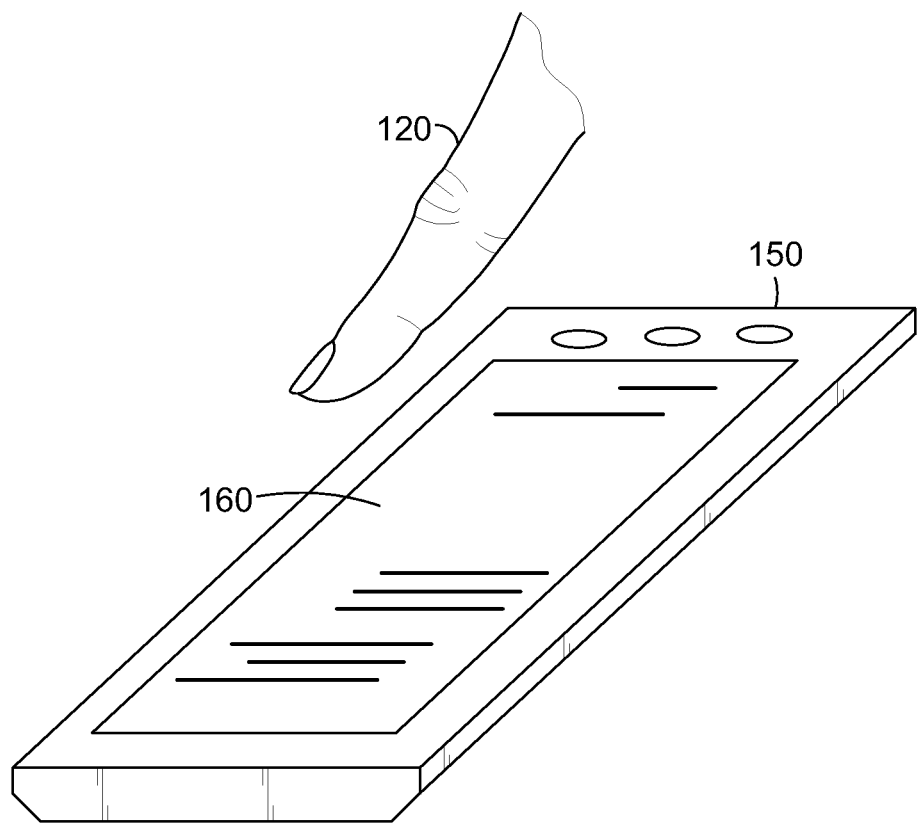
FIG. 1 is a diagram depicting an example of a tactile stimulation apparatus, in accordance with an example embodiment.

FIG. 1 is a diagram depicting an example of a tactile stimulation apparatus 150, in accordance with an example embodiment. It should be understood that "tactile" is defined as relating to a sensation of touch or pressure, and the tactile stimulation apparatus 150 is capable of creating a sensation of touch or pressure to a body member 120 (e.g., a finger) based on the creation of a pulsating Coulomb force, as will be explained in more detail by way of example below.

The tactile stimulation apparatus 150 may be in the form of a tactile display device that is capable of displaying graphics as well as creating a sensation of touch to the body member 120. FIG. 1 depicts an example of such a tactile display device in the form of a smart phone having a touch screen panel 160 (or touch-sensitive screen) that is responsive to touches by the body member 120. That is, touching different portions of the touch screen panel 160 with the body member 120 may cause the smart phone to take various actions.

In addition to displaying graphics, the touch screen panel 160 can also create a sensation of touch or pressure to the body member 120. The creation of the touch sensation to the body member 120 may involve the generation of high voltages, which may possibly result in an electrical shock to the body member 120. To possibly prevent or suppress the electrical shock, a region of the touch screen panel 160 may comprise a semiconducting material that may limit a flow of current to the body member 120. Additionally, the semiconducting material may also be used to reduce the thickness of the touch screen panel 160, as also described in more detail by way of example below. In addition to the smart phone depicted in FIG. 1, the tactile stimulation apparatus 150 may include a variety of other apparatuses, such as computer monitors, televisions, door handles, touch pads, mouse, keyboards, switches, and joysticks.

Figure 2A:
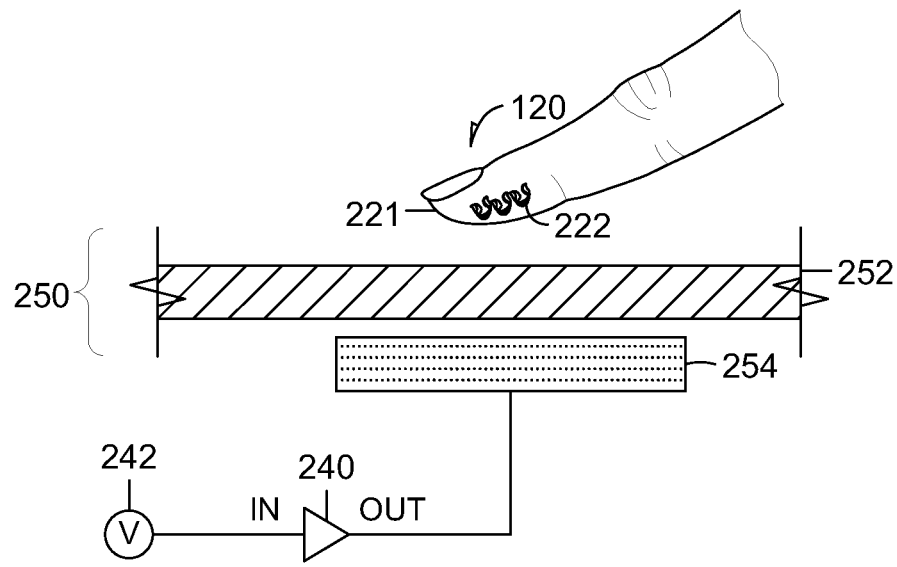
FIGS. 2A, 2B, 2C, and 2D depict diagrams of various composite section structures and components that may be included in tactile stimulation apparatuses, according to various example embodiments.

FIGS. 2A, 2B, 2C, and 2D are diagrams of various composite section structures and components that may be included in tactile stimulation apparatuses, according to various example embodiments. As depicted in FIG. 2A, an example of a tactile stimulation apparatus includes a composite section 250 and a voltage source 242 connected to the composite section 250 by way of a voltage amplifier 240. A "composite section," as used herein, refers to a distinct part or a number of parts that comprise a tactile stimulation apparatus. As depicted in FIGS. 2A, 2B, 2C, and 2D, the composite section 250 in one embodiment is an outer area of a tactile stimulation apparatus that is configured to be touched by the body member 120. Here, this example of the composite section 250 has a thickness and, in an embodiment, the composite section 250 comprises an insulation region 252, which is touchable by the body member 120, and a semiconducting region 254.

The insulation region 252 is an area, section, or portion of the composite section 250 that comprises one or more insulation materials. An insulator is a material that does not conduct electricity or is a material having such low conductivity that the flow of electricity through the material is negligible. Examples of insulation materials include glass, polyethylene, wood, rubber-like polymers, Polyvinyl chloride, silicone, Teflon, ceramics, and other insulation materials.

The semiconducting region 254 is an area, section, or portion of the composite section 250 that comprises one or more semiconducting materials. A semiconductor is a material that has an electrical conductivity between that of a conductor and an insulator. Accordingly, a semiconducting region 254 is a region that is neither a perfect conductor nor a perfect isolator. The electrical conductivity of the semiconducting region 254 may be generally in the range $10^3$ Siemens/cm to $10^{-8}$ S/cm. However, rather than defining the limits of resistance of the semiconducting region 254, it can be useful to present dimensioning guidelines. In one embodiment, the surface resistance of the semiconducting region 254 may be such that the semiconducting region 254 can be charged in a reasonable time to a sufficient voltage for creating an electrosensory sensation (a sensation of apparent vibration) to the body member 120. In some applications, such a reasonable charging time is less than 500 milliseconds, where, in one example, the charging time varies between 0.1 and 500 milliseconds. It should be appreciated that charging times that are less than 200 milliseconds may provide a quick feedback to the user. The surface resistance of the semiconducting region 254 is also a function its surface area. The larger the surface, the smaller is the required surface resistance, if the charging time is to be kept reasonable. Examples of semiconducting materials include semiconductive transparent polymers, zinc oxides, carbon nanotubes, indium tin oxide (ITO), silicon, germanium, gallium arsenide, silicon carbide, and other semiconducting materials.

Referring to FIG. 2A, the output "OUT" of the voltage amplifier 240 is coupled to the semiconducting region 254, which, in this particular embodiment, functions as an electrode. The insulation region 252 insulates the semiconducting region 254 against galvanic contact by the body member 120. In general, the voltage source 242 is a device that produces an electromotive force and, in this embodiment, is configured to charge the semiconducting region 254 to an electric potential, which is a point in an electric field expressed in volts, thereby producing an electrosensory sensation on the body member 120. Particularly, the insulation region 252 prevents a flow of direct current from the semiconducting region 254 to the body member 120. As a result, a capacitive coupling over the insulation region 252 is formed between the semiconducting region 254 and the body member 120, and this capacitive coupling produces an electrosensory sensation on the body member 120. Upon application of the charge, the capacitive coupling of the electrode (or semiconducting region 254) and the body member 120 generates a pulsating Coulomb force. The pulsating Coulomb force may stimulate vibration-sensitive receptors, mainly those called Pacinian corpuscles 222, which reside under the outermost layer of skin in the epidermis 221 of the body member 120.

The voltage amplifier 240 is driven by a signal "IN," as generated by the voltage source 242, and this signal results in a substantial portion of the energy content of the resulting Coulomb force to reside in a frequency range to which the Pacinian corpuscles 222 may be sensitive. For humans, this frequency range can be between 10 Hz and 1000 Hz. For example, the frequency can be between 50 Hz and 500 Hz or between 100 Hz and 300 Hz, such as about 240 Hz.

The voltage amplifier 240 and the capacitive coupling over the insulation region 252 are dimensioned such that the Pacinian corpuscles 222 or other mechanoreceptors are stimulated and an electrosensory sensation is produced. For this, the voltage amplifier 240 (or voltage source 242) may generate an output of several hundred volts or even several kilovolts. The alternating current driven into the body member 120 by way of capacitive coupling has a very small magnitude and can be further reduced by using, for example, a low-frequency alternating current.

It should be appreciated that galvanic grounding sets the human potential close to ground, and creates a strong potential difference and electric field between the composite section 250 and the body member 120. Galvanic grounding works well if the user is touching properly the conductive ground electrode. However in examples of a very light touch, only a very small contact area is in use, and local (capacitive) current may produce a spark or electric shock, which can cause irritation to the body member 120. The semiconducting region 254 may limit the flow of local current thorough a small area and thus to the body member 120. As a result, the limit of the current flow may suppress or prevent electrical shocks to the body member 120, thereby possibly reducing irritation to the body member 120.

Additionally, the semiconducting region 254 may be used to reduce a thickness of the insulation region 252. In particular, a high current density electron channel may be formed when there is an electric breakdown, which is a rapid reduction in the resistance of an insulator that can lead to a spark jumping around or through the insulator (or insulation region 252). However, it may be that such electron channels cannot be formed in semiconducting materials because such materials have lower charge carrier density. Hence, electric breakdown is unlikely to occur with the use of semiconducting materials even with the application of a high electric field. As a result, the insulation region 252 may also be decreased, thereby resulting in reduced thickness of the insulation region 252. It should be appreciated that near the lower limit of this voltage range, the insulator thickness may be as thin as one atom layer or, in other examples, may be between about 0.01 mm and about 1 mm, between about 1 µm and about 2 mm, greater than about 2 mm, between about 20 µm and about 50 µm, or less than about 20 µm. As used herein, the term "about" means that the specified dimension or parameter may be varied within an acceptable manufacturing tolerance for a given application. In some embodiments, the acceptable manufacturing tolerance is ±10%. As material technology and nanotechnology develop, even thinner durable insulating sections may become available, and this may also permit a reduction of the voltages used.

It should also be appreciated that the voltage source 242 does not need to be physically coupled to the semiconducting region 254 to be able to charge the semiconducting region 254 to an electric potential. In an alternate embodiment, the voltage source 242 may be proximate to the semiconducting region 254, but not physically connected. In particular, the electric field generated by the voltage source 242 may charge the semiconducting region 254 to an electric potential without the voltage source 242 physically connected to the semiconducting region 254. This capacitive transfer of energy may also be a type of capacitive coupling and referred to as a capacitive connection.

Figure 2B:
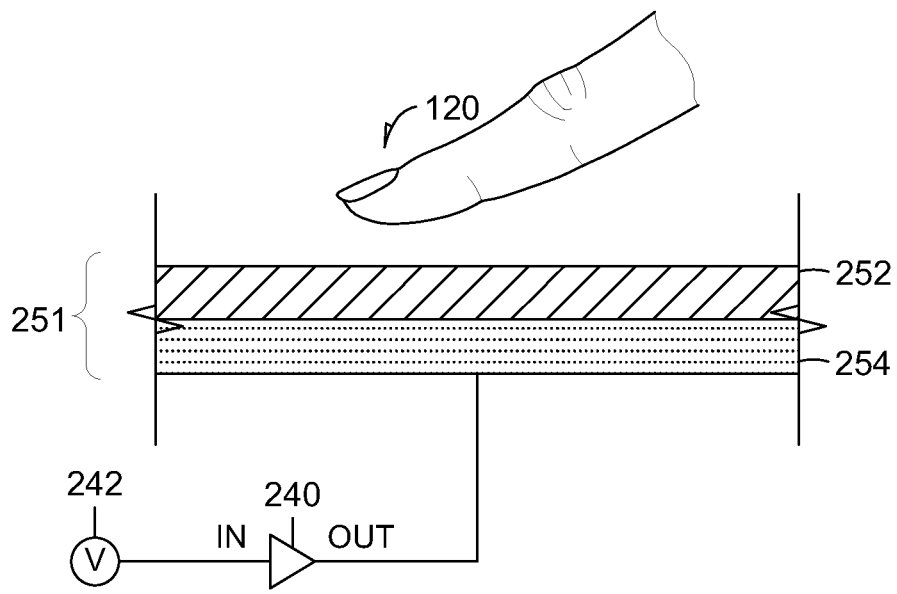

The semiconducting region 254 depicted in FIG. 2A is proximate to the insulation region 252, but it should be appreciated that the composite section 250 may also have a variety of other different structures. FIG. 2B depicts a diagram of a different composite section structure, consistent with an alternative embodiment. This composite section 251 also comprises of an insulation region 252 and a semiconducting region 254. Similarly, the voltage source 242 is connected to the composite section 251 by way of a voltage amplifier 240. The insulation region 252 is touchable by the body member 120 and the semiconducting region 254 is disposed below the insulation region 252.

The insulation region 252 comprises a piece of insulation material, such as a sheet of glass. The semiconducting region 254 comprises a different piece of semiconducting material, such as a sheet of a semiconductive transparent polymer. The piece of insulation material that forms the insulation region 252 is physically distinct from the piece of semiconducting material that forms the semiconducting region 254. The composite section 251 is formed from adhering the piece of insulation material together with the piece of semiconducting material.

Figure 2C:
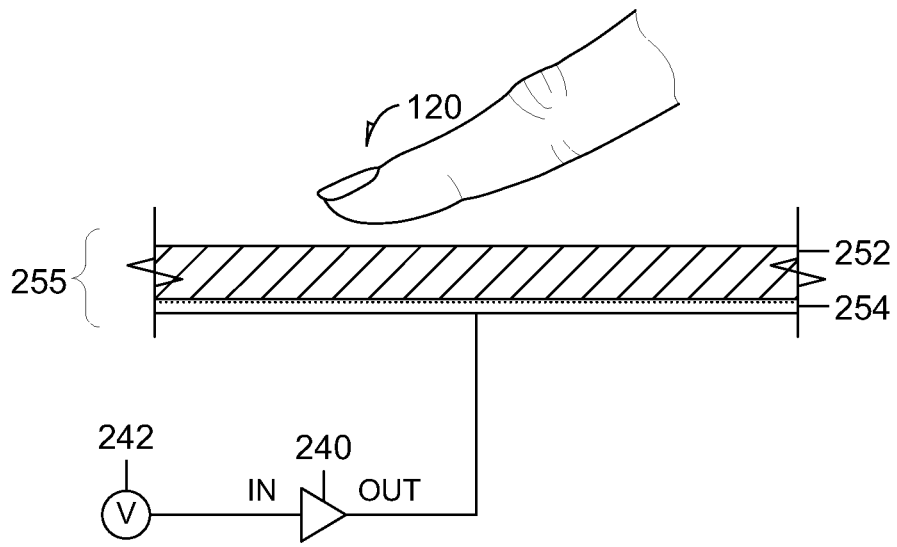

FIG. 2C depicts a diagram of another composite section structure, in accordance with yet another example embodiment. This composite section 255 also comprises an insulation region 252 and a semiconducting region 254. Similarly, the voltage source 242 is connected to the composite section 255 by way of a voltage amplifier 240. The insulation region 252 is touchable by the body member 120 and the semiconducting region 254 is disposed below the insulation region 252.

The insulation region 252 has a side or surface that is touchable by the body member 120 and an opposite side or surface. In this embodiment, a layer of a semiconducting material is spread over this opposite surface of the insulation region 252. This layer of semiconducting material forms the semiconducting region 254. It should be appreciated that the layer of the semiconducting material may be a thin layer. For example, in one embodiment, the layer may be as thin as one atom layer. In other example embodiments, thicknesses of the semiconducting region 254 may be between about 1 µm and about 200 µm, greater than about 200 µm, or between about 20 µm to 50 µm.

Figure 2D:
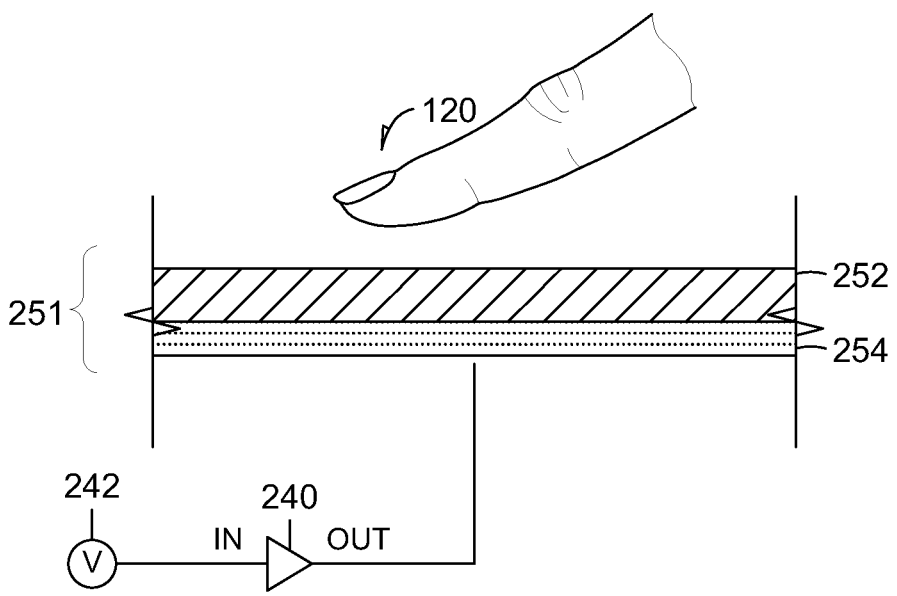

FIG. 2D depicts a diagram of yet another composite section structure, in accordance with another example embodiment. This composite section 257 also comprises an insulation region 252 and a semiconducting region 254. Similarly, the voltage source 242 is connected to the composite section 257 by way of a voltage amplifier 240. The insulation region 252 is touchable by the body member 120 and the semiconducting region 254 is disposed below the insulation region 252.

However, in this embodiment, the composite section 257 is not formed from two separate pieces of materials. Rather, the insulation region 252 and the semiconducting region 254 initially comprise a single piece of insulation material, and a dopant may be added to a portion of the insulation material to change the material property of the portion to a semiconducting material. Particularly, the addition of the dopant increases the conductivity of the portion of the insulation material to change its material property to that of a semiconducting material. Doping may be by way of oxidation (p-type doping) or by way of reduction (n-type doping). This doped portion forms the semiconducting region 254. Examples of such dopants include conductive polymers, which are generally classified as polymers with surface resistivity from $10^1$ to $10^7$ ohms/square. Polyaniline (PANI) is an example of a conductive polymer. Other examples of dopants that may be used include carbon nanotubes, conductive carbons, carbon fibers, stainless steel fibers, gallium arsenide, sodium naphthalide, bromine, iodine, arsenic pentachloride, iron (III) chloride, and nitrosyl ($NOPF_6$).

Vice versa, in an alternate embodiment, the composite section 257 may initially comprise a single piece of semiconducting material, and a dopant may be added to a portion of the semiconducting material to change the portion to an insulation material. In other words, the insulation region 252 and the semiconducting region 254 initially comprise a single piece of semiconducting material, and a dopant may be added to a portion of the semiconducting material to change the material property of the portion to an insulation material. The addition of the dopant decreases the conductivity of the portion of the semiconducting material to change its material property to that of an insulation material. This doped portion forms the insulation region 252.

Figure 3:
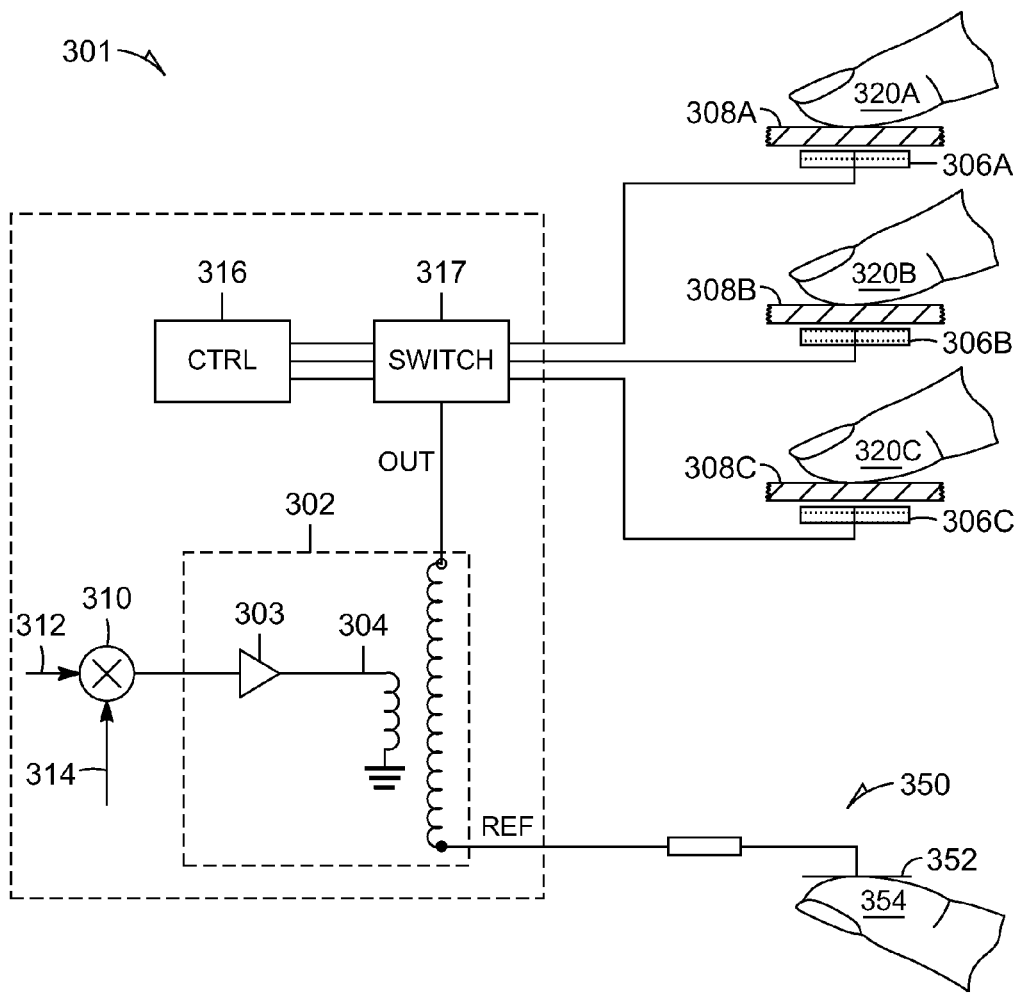
FIG. 3 is a circuit diagram, which implements an illustrative example embodiment of a tactile stimulation apparatus.

FIG. 3 is a circuit diagram, which implements an illustrative example embodiment of a tactile stimulation apparatus 301. In this embodiment, the voltage amplifier 302 is implemented as a current amplifier 303 followed by a voltage transformer 304. The secondary winding of the voltage transformer 304 is in, for example, a flying configuration with respect to the remainder of the tactile stimulation apparatus 301. The amplifiers 302 and 303 are driven with a modulated signal whose components as inputted in a modulator 310 are denoted by 312 and 314. The output of the voltage amplifier 302 is coupled to a switch array 317, which in turn is coupled to a controller 316 and electrodes 306A, 306B, and 306C that comprise a semiconductor material. The electrodes 306A, 306, B, and 306C are insulated against galvanic contact by insulation regions 308A, 308B, and 308C. The embodiment described in connection with FIG. 3 involves multiple electrodes 306A, 306B, and 306C, but each electrode alone 306A, 306B, or 306C stimulates a distinct area of skin of body member 320A, 320B, or 320C, or more precisely, the mechanoreceptors, including the Pacinian corpuscles underlying the outermost layers of skin. Therefore, a configuration of n electrodes 306A, 306B, and 306C may convey n bits of information in parallel.

Although not strictly necessary, it may be possibly beneficial to provide a grounding connection which helps to bring a user closer to a well-defined (non-floating) potential with respect to the voltage section of the tactile stimulation apparatus 301. In an embodiment, a grounding connection 350 connects a reference point REF of the voltage section to a body member 354, which is different from the body members 320A, 320B, and 320C to be stimulated. The reference point REF is at one end of the secondary winding of the transformer 304, while the drive voltage for the electrodes 306A, 306B, and 306C is obtained from the opposite end of the secondary winding. In an illustrative embodiment, the tactile stimulation apparatus 301 is a hand-held apparatus, which comprises a touch screen panel activated by body member(s) 320A, 320B, and/or 320C. The grounding connection 350 terminates at a grounding electrode 352, which can form a surface of the tactile stimulation apparatus 301.

The grounding connection 350 between the reference point REF and the non-stimulated body member 354 may be electrically complex. In addition, hand-held apparatuses typically lack a solid reference potential with respect to the surroundings. Accordingly, the term "grounding connection" does not require a connection to a solid-earth ground. Instead, a grounding connection means any suitable connection which helps to decrease the potential difference between the reference potential of the tactile stimulation apparatus 301 and a second body member (e.g., body member 354) distinct from the body member(s) to be stimulated (e.g., body members 320A, 320B, and 320C). The non-capacitive coupling 350 (or galvanic coupling) between the reference point REF of the voltage section and the non-stimulated body member 354 may possibly enhance the electrosensory sensation experienced by the stimulated body members 320A, 320B, and 320C. Conversely, an equivalent electrosensory stimulus can be achieved with a lower voltage and/or over a thicker insulator with use of grounding connection 350.

As discussed above, the amplifiers 302 and 303 are driven with a high-frequency signal 312, which is modulated by a low-frequency signal 314 in the modulator 310. The frequency of the low-frequency signal 314 is such that the Pacinian corpuscles are responsive to that frequency. The frequency of the high-frequency signal 312 may be slightly above the hearing ability of humans, such as between 18 kHz and 25 kHz, or between 19 kHz and 22 kHz.

The embodiment described in FIG. 3 may produce a steady state electrosensory sensation as long as the body member 320A, 320B, or 320C is in the vicinity of the electrode 306A, 306B, or 306C, respectively. In order to convey useful information, the electrosensory sensation may be modulated. Such information-carrying modulation can be provided by electronically controlling one or more operating parameters. For example, such information carrying modulation can be provided by controller 316, which controls one or more of the operating parameters. For instance, the controller 316 may enable, disable, or alter the frequency or amplitude of the high or low frequency signals 312, 314, the gain of the amplifier 302, or may controllably enable or disable the voltage source (not shown separately) or controllably break the circuit at any suitable point.

Figure 4:
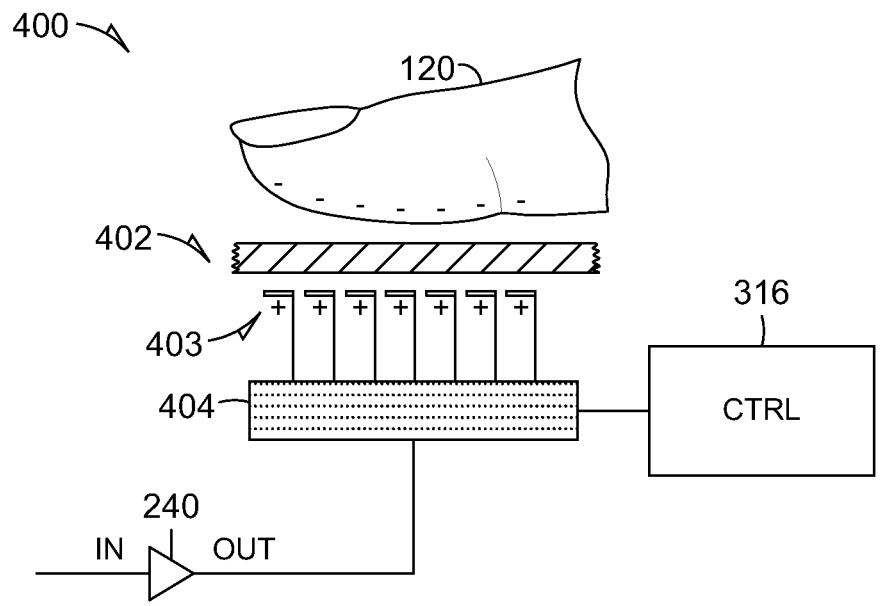
FIG. 4 is a circuit diagram depicting an example embodiment of a tactile stimulation apparatus wherein a strength of the capacitive coupling is adjusted by electrode movement.

FIG. 4 is a circuit diagram depicting an example embodiment of a tactile stimulation apparatus 400 wherein a strength of the capacitive coupling is adjusted by electrode movement. The composite section of the tactile stimulation apparatus 400 includes a set of electrodes 404 comprising a semiconducting material and an insulation region 402 disposed above the set of electrodes 404. This set of electrodes 404 forms a semiconducting region of the composite section and is coupled to a controller 316 and a voltage amplifier 240. Generation of an electric field, and its variation, is effected by way of the set of electrodes 404, which comprises individual electrodes 403. The individual electrodes 403 may be separated by insulator elements, so as to prevent sparking or shorting between the electrodes 403.

In this embodiment, the individual electrodes 403 are individually controllable, wherein the controlling of one of the electrodes 403 affects its orientation and/or protrusion. The set of electrodes 404 is oriented, by way of the output signal from the controller 316, such that the set of electrodes 404 collectively form a plane under the insulation region 402. In this example, the voltage current (DC or AC) from the voltage amplifier 240 to the set of electrodes 404 generates an opposite-signed charge (negative charge) of sufficient strength to the body member 120 in close proximity to the composite section. A capacitive coupling between the body member 120 and the tactile stimulation apparatus 400 is formed over the insulation region 402, which may produce an electrosensory sensation on the body member 120.

Figure 5:
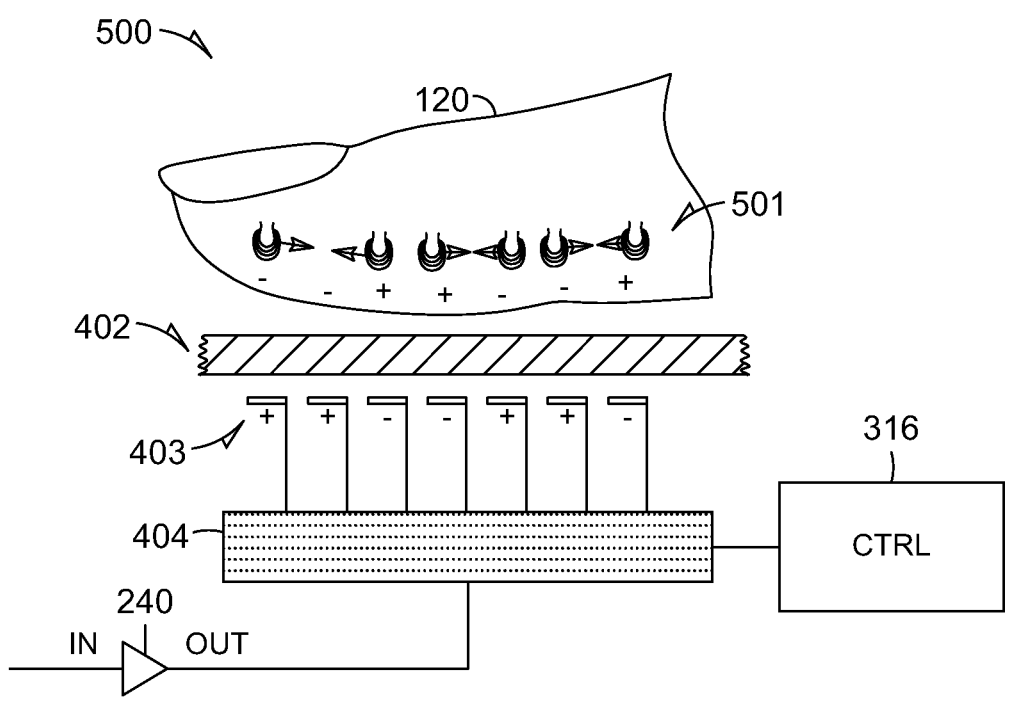
FIG. 5 is a circuit diagram depicting an example embodiment of a tactile stimulation apparatus wherein individual electrodes in a set of electrodes may have opposite charges.

FIG. 5 is a circuit diagram depicting an example embodiment of a tactile stimulation apparatus 500 wherein individual electrodes 403 in the set of electrodes 404 may have opposite charges. The composite section of the tactile stimulation apparatus 500 includes a set of electrodes 404 comprising a semiconducting material and an insulation region 402 disposed above the set of electrodes 404. This set of electrodes 404 forms a semiconducting region of the composite section and is coupled to a controller 316 and a voltage amplifier 240.

The charges of individual electrodes 403 may be adjusted and controlled by way of the controller 316. The capacitive coupling between the tactile stimulation apparatus 500 and the body member 120 may give rise to areas having charges with opposite signs 501 (positive and negative charges). Such opposing charges are mutually attractive to one another. Hence, it is possible that Coulomb forces stimulating the Pacinian corpuscles may be generated not only between the tactile stimulation apparatus 500 and the body member 120, but also between infinitesimal areas within the body member 120 itself.

Figure 6:
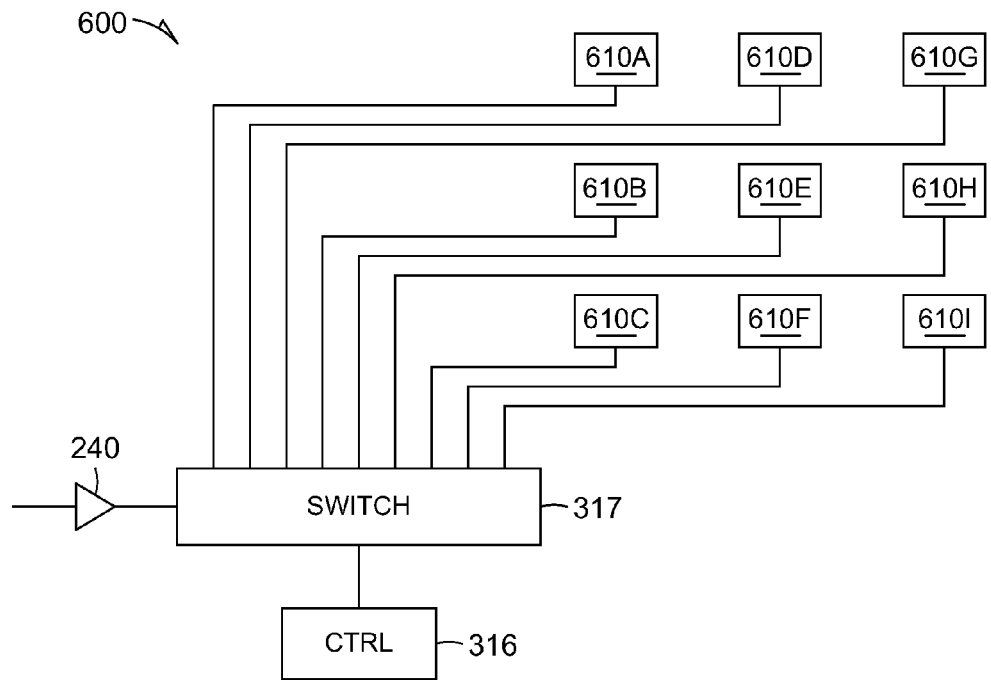
FIG. 6 is a circuit diagram depicting another example embodiment of a tactile stimulation apparatus having a group of individually controllable electrodes.

FIG. 6 is a circuit diagram depicting another example embodiment of a tactile stimulation apparatus 600 having a group of individually controllable electrodes 610a-610i. The individually controllable electrodes 610a-610i comprise a semiconducting material and, as depicted in FIG. 6, they are organized in the form of a matrix and are coupled to a switch array 317, which in turn is coupled to a controller 316 and a voltage amplifier 240. Such a matrix can be integrated into a tactile display device. For example, the electrodes 610a-610i can be positioned behind a touch screen panel, wherein "behind" means the side of the touch screen panel opposite to the side facing the user during normal operation. The electrodes 610a-610i can be very thin and/or transparent, whereby the electrodes 610a-610i can overlay the touch screen panel on the side facing the user.

The electric charges, which are conducted from the voltage amplifier 240 to the electrodes 610a-610i by way of the switch array 317, may all have similar signs or may have different signs, as illustrated above in FIG. 5. For instance, the controller 316, as depicted in FIG. 6, may control the switches in the switch array 317 individually, or certain groups may form commonly controllable groups. The surface of an individual electrode 610a-610i and/or its associated insulator can be specified according to the intended range of operations or applications. For example, a minimum area is about 0.01 cm², while a maximum area is roughly equal to the size of a human hand.

The matrix of electrodes 610a-610i and the switch array 317 provide a spatial variation of the electrosensory sensations. That is, the electrosensory sensation provided to the user depends on the location of the user's body member, such as a finger, proximate to the tactile stimulation apparatus 600 having a touch screen panel with the electrodes 610a-610i. The spatially varying electrosensory sensation may, for example, provide the user with an indication of the layout of the touch-sensitive areas of the touch screen panel. Accordingly, the tactile stimulation apparatus 600 depicted in FIG. 6 can produce a large number of different touch-sensitive areas, each with a distinct "feel" or a different pattern for the temporal and spatial variation of the electrosensory sensation.

Figure 7:
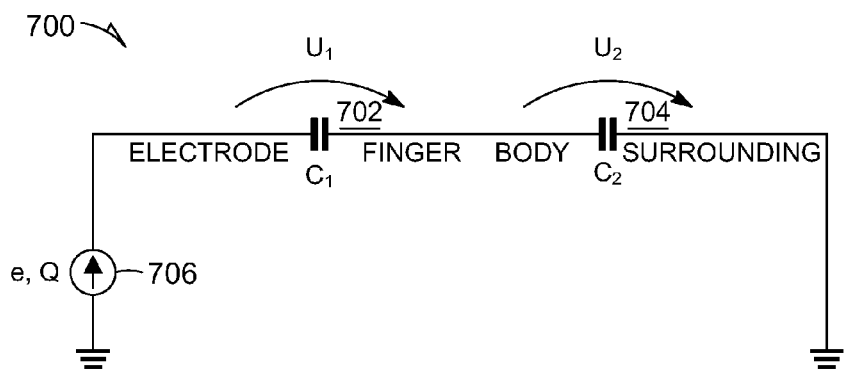
FIG. 7 is a circuit diagram depicting a distribution of an electric field-generating potential in capacitive couplings when a tactile stimulation apparatus is grounded, in accordance with an example embodiment.

FIG. 7 is a circuit diagram depicting a distribution of an electric field-generating potential in capacitive couplings when a tactile stimulation apparatus 700 is grounded, in accordance with an example embodiment. As depicted, two capacitors 702 and 704 and a voltage source 706 are coupled in series. In general, the drive voltage e of an electrode is divided based on the ratio of capacitances C1 and C2, wherein C1 is the capacitance between a body member (e.g., a finger) and the electrode, and C2 is the stray capacitance of the user. The electric field experienced by a body member is:

$$U1 = \frac{e * C2}{C1 + C2}$$

This voltage U1 is lower than the drive voltage e from the voltage source 706. The reference potential of the tactile stimulation apparatus 700 may be floating, as will be described in more detail by way of example below, which may further decrease the electric field directed to the body member. Some embodiments aim at keeping the capacitance C1 low in comparison to that of C2. Here, at least capacitance C1 is not significantly higher than C2. Other embodiments aim at adjusting or controlling C2, for instance by coupling the reference potential of the tactile stimulation apparatus 700 back to the user.

Stray capacitances can be controlled by arrangements in which several electrodes are used to generate potential differences among different areas of a composite section. By way of example, this technique can be implemented by arranging a side of a touch screen panel of a hand-held device (e.g., the top side of the device) to a first electric potential, while the opposite side is arranged to a second electric potential, wherein the two different electric potentials can be the positive and negative poles of the hand-held device. Alternatively, a first surface area can be the electric ground (reference electric potential), while a second surface area is charged to a high electric potential. Moreover, within the constraints imposed by the insulator layer(s), it is possible to form minuscule areas of different electric potentials, such as electric potentials with opposite signs or widely different magnitudes, wherein the areas are small enough that a body member is simultaneously subjected to the electric fields from several areas of a surface with different potentials.

Figure 8:
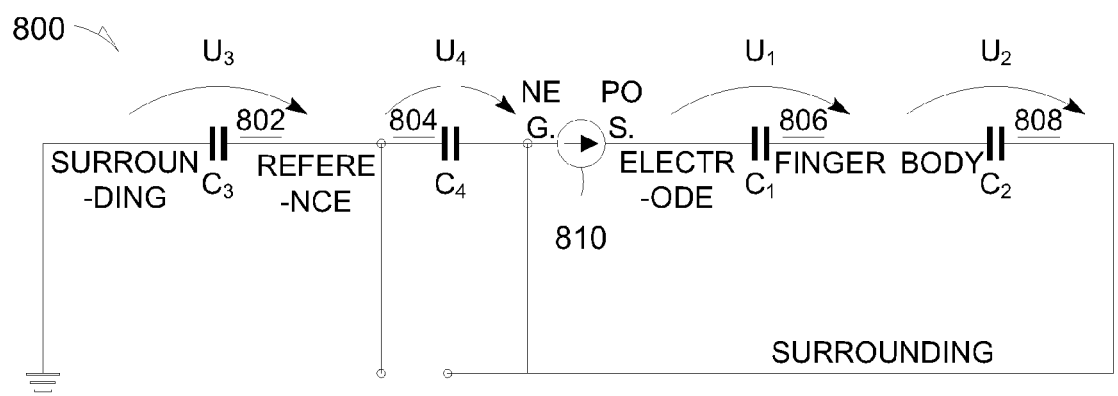
FIG. 8 is a circuit diagram depicting another example embodiment of a tactile stimulation apparatus having a floating voltage source.

FIG. 8 is a circuit diagram depicting another example embodiment of a tactile stimulation apparatus 800 having a floating voltage source. As depicted, the tactile stimulation apparatus 800 includes capacitors 802, 804, 806, and 808 coupled to a floating voltage source 810 that is floating. This floating voltage source 810 can be implemented, by way of inductive or capacitive coupling and/or with break-before-make switches. A secondary winding of a transformer is an example of a floating voltage source.

By measuring the voltage U4, it is possible to detect a change in the value(s) of capacitance(s) C1 and/or C2. Assuming that the floating voltage source 810 is a secondary winding of a transformer, the change in capacitance(s) C1 and/or C2 can be detected on the primary side as well, for example as a change in load impedance. Such a change in capacitance(s) C1 and/or C2 serves as an indication of a touching or approaching body member. In one embodiment, the tactile stimulation apparatus 800 is arranged to utilize this indication of the touching or approaching body member such that the tactile stimulation apparatus 800 uses a first (lower) voltage to detect the touching or approaching by the body member and a second (higher) voltage to provide feedback to the user. For example, such a detection of the touching by the body member using the lower voltage may trigger automatic unlocking of a tactile stimulation apparatus or may activate illumination of a touch screen panel. The feedback using the higher voltage may indicate any one or more of the following: the outline of each touch-sensitive area; a detection of the touching or approaching body member by the tactile stimulation apparatus 800; the significance of (the act to be initiated by) the touch-sensitive area; or other information processed by the application program and may be potentially useful to the user.

Figure 9:
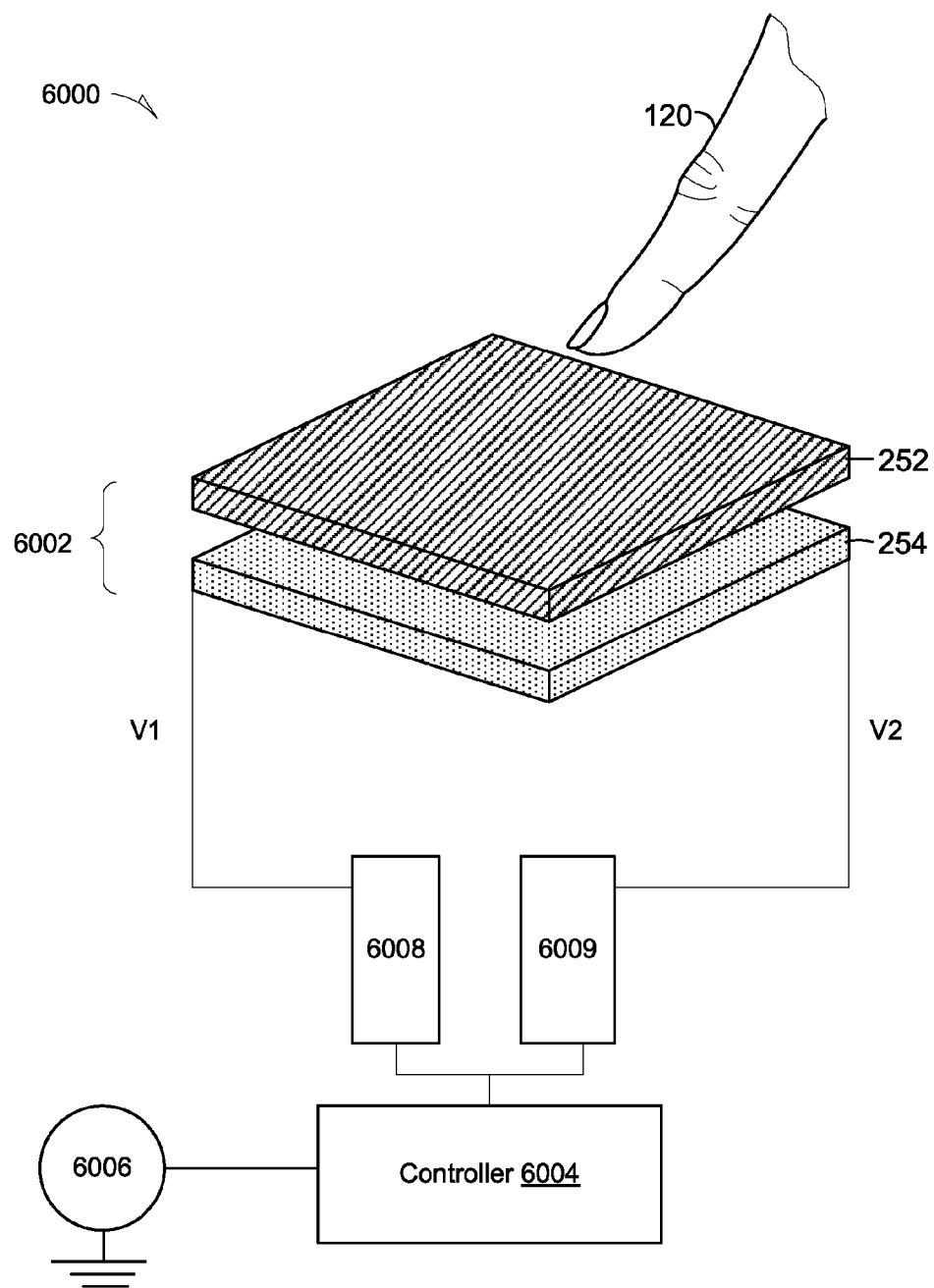
FIG. 9 is a circuit diagram illustrating another example embodiment of a tactile stimulation apparatus.

FIG. 9 is a circuit diagram illustrating another example embodiment of a tactile stimulation apparatus 6000. In this embodiment, the tactile stimulation apparatus 6000 includes a composite section 6002 connected to two different voltage sources 6008 and 6009, which are connected to a power source 6006 by way of a controller 6004. In this example, the composite section 6002 comprises an insulation region 252, which is touchable by body member 120, and a semiconducting region 254 proximate to the insulation region 252. The semiconducting region 254 can be charged to a sufficient voltage for creating an electrosensory sensation to the body member 120. However, in this embodiment, the semiconducting region 254 is charged from at least two different points. As depicted in FIG. 9, the voltage source 6008 is connected to the semiconducting region 254 at one point while the voltage source 6009 is connected to the semiconducting region 254 at a different point.

Figure 10:
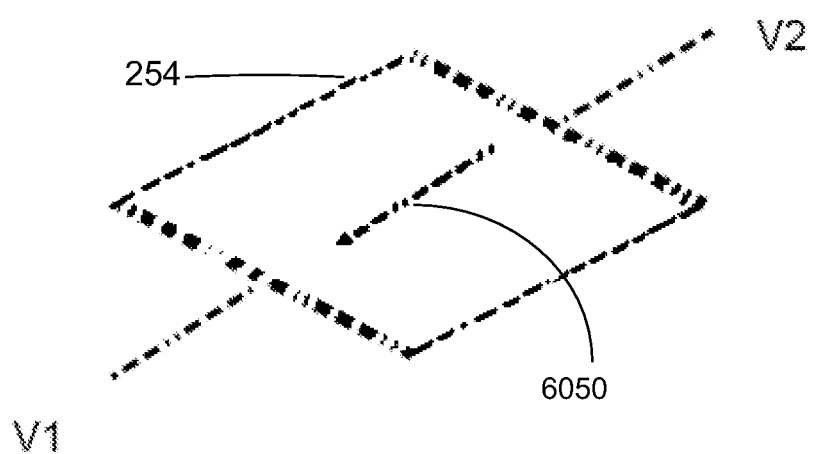
FIG. 10 depicts a spatial wave created on a surface of the semiconducting region 254, in accordance with an embodiment.

The controller 6004 can individually drive each voltage source 6008 or 6009. For example, the controller 6004 can drive voltage source 6008 to generate a voltage V1 at a different time phase from voltage V2, which is generated by voltage source 6009. In another example, the controller 6004 can also drive the voltage source 6008 to generate V1 at a different potential from voltage V2. The difference in potential between V1 and V2 may create a spatial wave on a surface of the semiconducting region 254. For example, FIG. 10 illustrates a surface of the semiconducting region 254. The edges of the semiconducting region 254 are connected to two different voltage sources that generate two different voltages V1 and V2. In this example, the voltage V2 is at a higher potential than voltage V1, thereby creating a spatial wave along direction 6050 on the surface of the semiconducting region 254. This spatial wave created by different potentials V1 and V2 may possibly enhance the electrosensory sensation experienced by the stimulated body member 120 depicted in FIG. 9.

Figure 11:
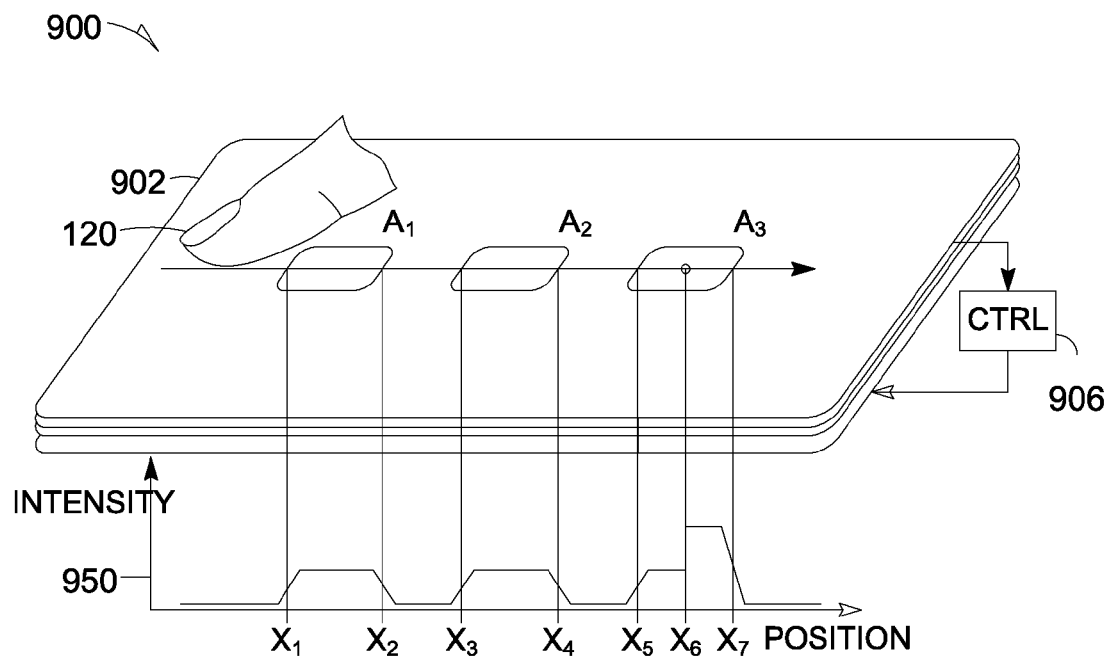
FIG. 11 is a schematic diagram depicting an example embodiment of a tactile display device having a single electrode that produces electrosensory sensations based on a location of a body member.

FIG. 11 is a schematic diagram depicting an example embodiment of a tactile display device 900 having a single electrode that produces electrosensory sensations based on a location of a body member 120. Here, the tactile display device 900 includes a touch screen panel 902, which is a touch-sensitive screen, and for purposes of describing the present embodiment, comprises three touch-sensitive areas A1, A2 and A3. The controller 906 detects the approaching or touching of the touch-sensitive areas A1, A2 and A3 by a body member 120.

The touch screen panel 902 comprises various regions of materials, such as insulation regions, a conductive region, and a semiconducting region. The layout of the regions is described in more detail by way of example below, but the various regions may form two different electrodes. One electrode (or "touch detection electrode") is dedicated to detect touch by the body member 120 while another electrode (or "electrosensory sensation electrode") is dedicated to produce an electrosensory sensation on the body member 120. In one example, to detect touch, an application of voltage to the touch detection electrode generates an electrostatic field. A touching by the body member 120 changes this electrostatic field, and the location of the body member 120 (e.g., A1, A2, or A3) can be identified based on these changes.

In addition to processing touch-screen functionalities, the controller 906 uses information of the position of the body member 120 to temporally vary the intensity of the electrosensory sensation produced by the electrosensory sensation electrode on the body member 120. Although the intensity of the electrosensory sensation is varied over time, time is not an independent variable in the present embodiment. Instead, timing of the temporal variations is a function of the location of the body member 120 relative to the touch-sensitive areas (e.g., A1, A2 and A3). Accordingly, the tactile display device 900 depicted in FIG. 11 is operable to cause variations in the intensity of the electrosensory sensation produced by the electrosensory sensation electrode on the body member 120, wherein the variations are based on the location of the body member 120 relative to the touch-sensitive areas of the touch screen panel 902. In other words, the intensity of the electrosensory sensation may be varied based on the location of the body member 120.

The graph 950 depicted below the touch screen panel 902 illustrates this functionality. The three touch-sensitive areas A1, A2 and A3 are demarcated by respective x coordinate pairs {x1, x2}, {x3, x4} and {x5, x7}. The controller 906 does not sense the presence of the body member 120 as inactive, as long as the body member 120 is to the left of any of the touch-sensitive areas A1, A2 and A3. In this example, the controller 906 responds by applying a low-intensity signal to the electrosensory sensation electrode. As soon as the body member 120 crosses the x coordinate value x1, the controller 906 detects the body member 120 over the first touch-sensitive area A1 and starts to apply a medium-intensity signal to the electrosensory sensation electrode. Between the areas A1 and A2 (between x coordinates x2 and x3), the controller 906 again applies a low-intensity signal to the electrosensory sensation electrode. The second touch-sensitive area A2 is processed similarly to the first touch-sensitive area A1, but the third touch-sensitive area A3 is processed somewhat differently. As soon as the controller 906 detects the body member 120 above or in close proximity to the area A3, it begins to apply the medium-intensity signal to the electrosensory sensation electrode (and also similarly to areas A1 and A2). However, the user decides to press the touch screen panel 902 at a point x6 within the third area A3. The controller 906 detects the finger press (activation of a particular function assigned to the area A3) and responds by applying a high-intensity signal to the electrosensory sensation electrode. Thus, the embodiment of the tactile display device 900 can provide the user with a tactile feedback, which creates an illusion of a textured surface, although only a single electrosensory sensation electrode is used to create the electrosensory sensation.

To facilitate integration of a tactile stimulation apparatus with capacitive devices, such as the tactile display device 900, the region that comprise the touch detection electrode or other regions may comprise a semiconducting material, which may separate the tactile stimulation regions from the touch sensitive regions. At the voltage and current levels associated with the touch sensitive regions or functionalities, the semiconducting region functions as an insulator, meaning that the semiconducting region does not hinder the operation of the capacitive device. However, at the voltage, frequency, current levels, or other spatial topologies associated with the tactile stimulation regions or associated functionalities, the semiconducting region functions as a conductor, meaning that the semiconducting region can be used as the electrode by which a current is conducted over the capacitive coupling to the body member 120, as discussed above.

Figure 12A:
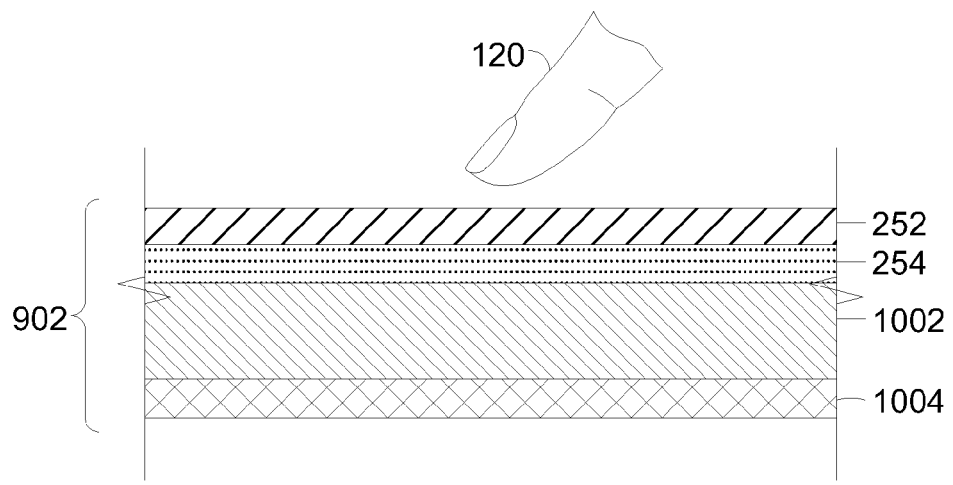
FIGS. 12A and 12B are diagrams of the various regions of materials that may comprise different example embodiments of a touch screen panel.
Figure 12B:
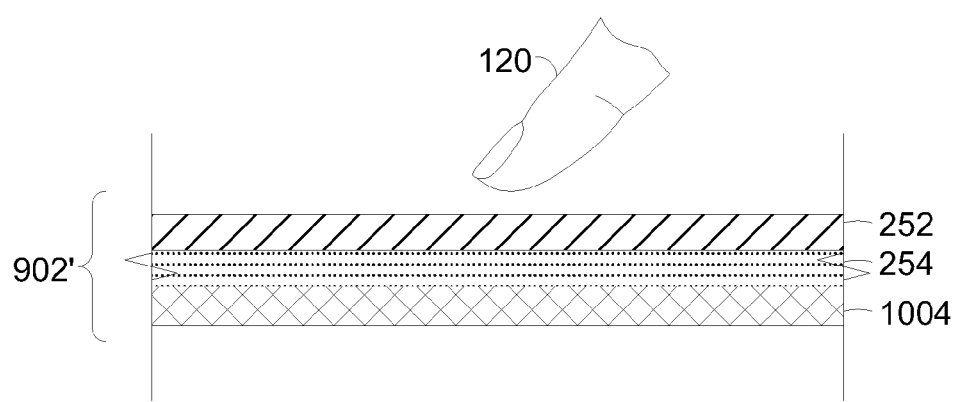

FIGS. 12A and 12B are diagrams of the various regions of materials that may comprise different example embodiments of a touch screen panel. As depicted in FIG. 12A, an embodiment of the touch screen panel 902 includes a conductive region 1004, an insulation region 1002 disposed above the conductive region 1004, a semiconducting region 254 disposed above the insulation region 1002, and another insulation region 252 disposed above the semiconducting region 254.

In this embodiment, the insulation region 1002 and the conductive region 1004 may comprise a conventional touch screen panel. The conductive region 1004 forms an electrode (or the "touch electrode" as discussed above) that functions to detect touch of the body member 120, and is different from the electrode described above that produces an electrosensory sensation on the body member 120. This conductive region 1004 may comprise metallic or transparent conductive material. Depending on the conductivity, in one example, a thickness of the conductive region 1004 may be between about 1 µm and about 200 µm. In other examples, a thickness of the conductive region 1004 may be less than about 1 µm or greater than about 200 µm.

The insulation region 1002 disposed above the conductive region 1004 may comprise a transparent insulation material, such as glass. In one example, a thickness of the insulation region 1002 may be between about 10 µm and about 2 mm. In another example, a thickness of the insulation region 1002 may be greater than about 2 mm. In yet another example, a thickness of the insulation region 1002 may be between about 0.4 mm and 0.7 mm.

To suppress electrical shocks to the body member 120 or for other functionalities, the semiconducting region 254 may be included in the touch screen panel 902. This semiconducting region 254 also forms an electrode (or the "electrosensory sensation electrode" as discussed above) that functions to produce an electrosensory sensation. For example, as explained in more detail below, a voltage source (not shown)

can charge the semiconducting region 254 to an electric potential to produce an electrosensory sensation on the body member 120. As a result, the embodiment of the touch screen panel 902 is configured to detect touch by the body member 120 as well as generating electrosensory sensation on the body member 120.

Here, the semiconducting region 254 may be disposed above the insulation region 1002 (or on top of a conventional touch screen panel). Another insulation region 252 is disposed above the semiconducting region 254. For example, a thin layer of semiconducting material, such as a semi-conductive transparent polymer, may be spread over a conventional touch screen panel, which comprises the insulation region 1002 and the conductive region 1004. Another piece of glass, which is an insulation material, may then be disposed above the layer of the semiconducting material.

In an alternative embodiment, the insulation region 1002 may be excluded from the touch screen panel 902. As depicted in FIG. 12B, this alternative embodiment of the touch screen panel 902' includes the conductive region 1004, the semiconducting region 254 disposed above the conductive region 1004, and the insulation region 252 disposed above the semiconducting region 254. Here, if the semiconducting region 254 is a sufficiently poor conductor, then the semiconducting region 254 may be disposed directly above the conductive region 1004. In one example, the semiconducting region 254 may be a sufficiently poor conductor if its surface resistivity is less than 10 ohms/square. However, it should be noted that in addition to the material property of the semiconducting region 254, the exclusion of an insulation region between the semiconducting region 254 and the conductive region 1004 may additionally depend on the capability of the touch sensitive regions (e.g., conductive region 1004) or other circuitry of a tactile display device to handle current leakage from the semiconducting region 254. Such a capability may depend on, for example, size of the conductive region 1004, size of the touch screen panel 902', grounding, and other properties.

It should be appreciated that the semiconducting region 254 depicted in FIGS. 12A and 12B (as well as the semiconducting regions and electrodes depicted in other figures) may be homogenous or non-homogenous. In one embodiment, a surface of the semiconducting region 254 may be non-homogenous such that, for example, the conductivity can be varied over the surface. For example, the semiconducting region 254 may comprise separately controllable isolated semiconducting areas where each area can be separately activated. Here, a greater range of electrosensory sensations may be generated by sequential or simultaneous activation of each element with voltages that vary between the different semiconducting areas. In another example, the surface of the semiconducting region 254 has a pattern, such as a structure of rows of hexagonal cells or other patterns, that may allow different electric field patterns to be produced. As a result, the geometry of the patterns may create different electrosensory sensations to the body member 120. In yet another example, a surface of the semiconducting region 254 may have surface areas with different conductivities, which allow the modification of charge flows to the various surface areas. Such a surface may, for example, be constructed using gradient doping. This surface may provide faster or slower flow of charge to the various surface areas of the semiconducting region 254. This controlled flow of charge may provide a more controlled electric field at a tactile display device and therefore, may result in better stability of the tactile display device. Additionally, this controlled flow can be used to modify the electrosensory sensations.

Figure 13:
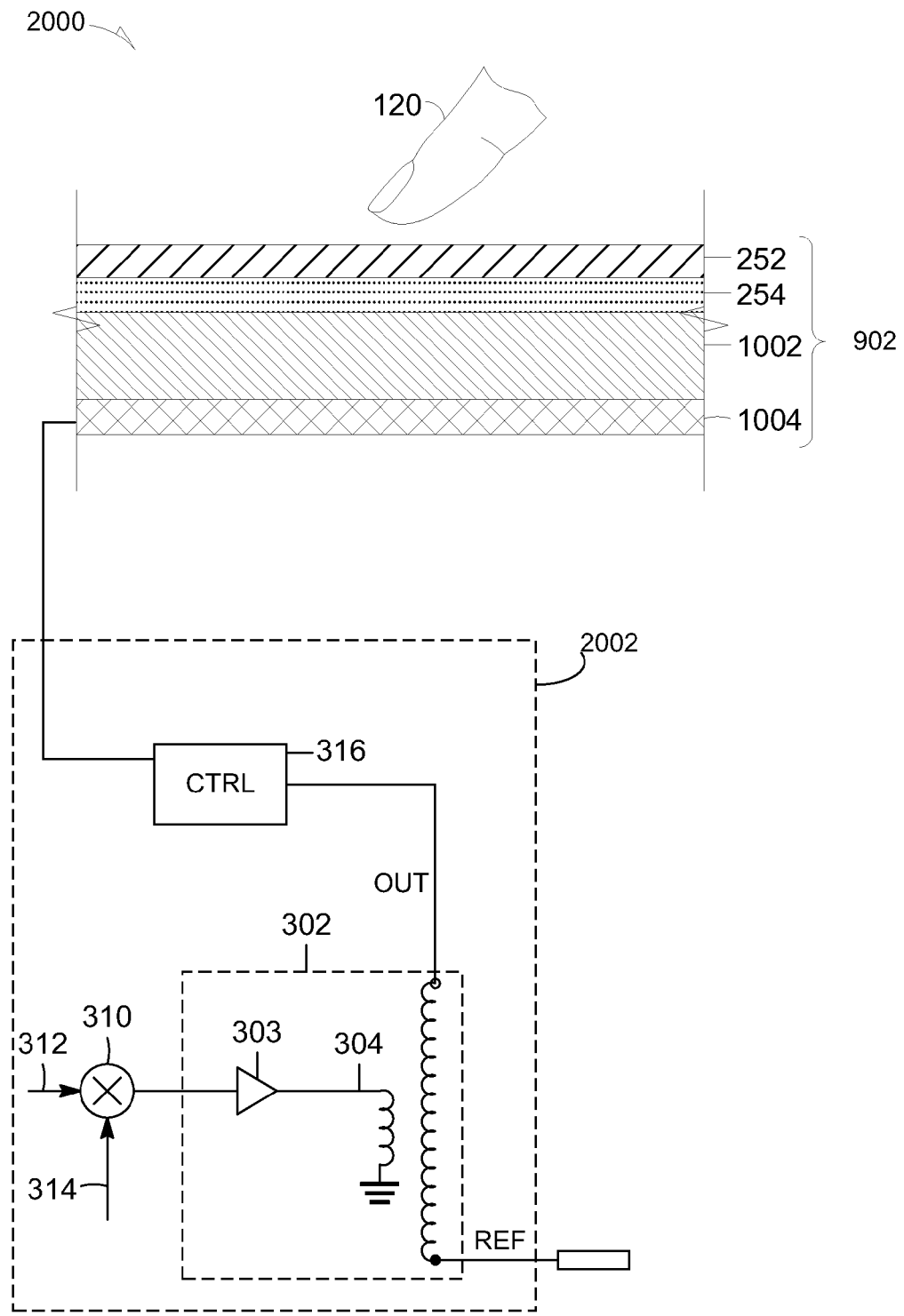
FIG. 13 is a diagram of an exemplary embodiment of circuitry configured to charge the touch screen panel depicted in FIG. 12A.

FIG. 13 is a diagram of an exemplary embodiment of circuitry configured to charge the touch screen panel depicted in FIG. 12A. As depicted in FIG. 13, a tactile display device 2000 includes circuitry 2002 and the touch screen panel 902 described in FIG. 12A. As described above, the touch screen panel 902 includes a conductive region 1004, an insulation region 1002 disposed above the conductive region 1004, a semiconducting region 254 disposed above the insulation region 1002, and another insulation region 252 disposed above the semiconducting region 254.

The circuitry 2002, in this embodiment, includes a voltage amplifier 302, which is implemented as a current amplifier 303 followed by a voltage transformer 304. The secondary winding of the voltage transformer 304 is in, for example, a flying configuration with respect to the remainder of the tactile display device 2000. The amplifiers 302 and 303 are driven with a modulated signal whose components as inputted in a modulator 310 are denoted by 312 and 314. The output of the voltage amplifier 302 is coupled to a controller 316 and in turn, to the conductive region 1004.

In this embodiment, the semiconducting region 254 is charged by way of capacitive connection. In particular, the conductive region 1004 is charged to float at a high potential, thereby transferring or charging the semiconducting region 254 to an electric potential to create an electrosensory sensation to the body member 120.

Figure 14:
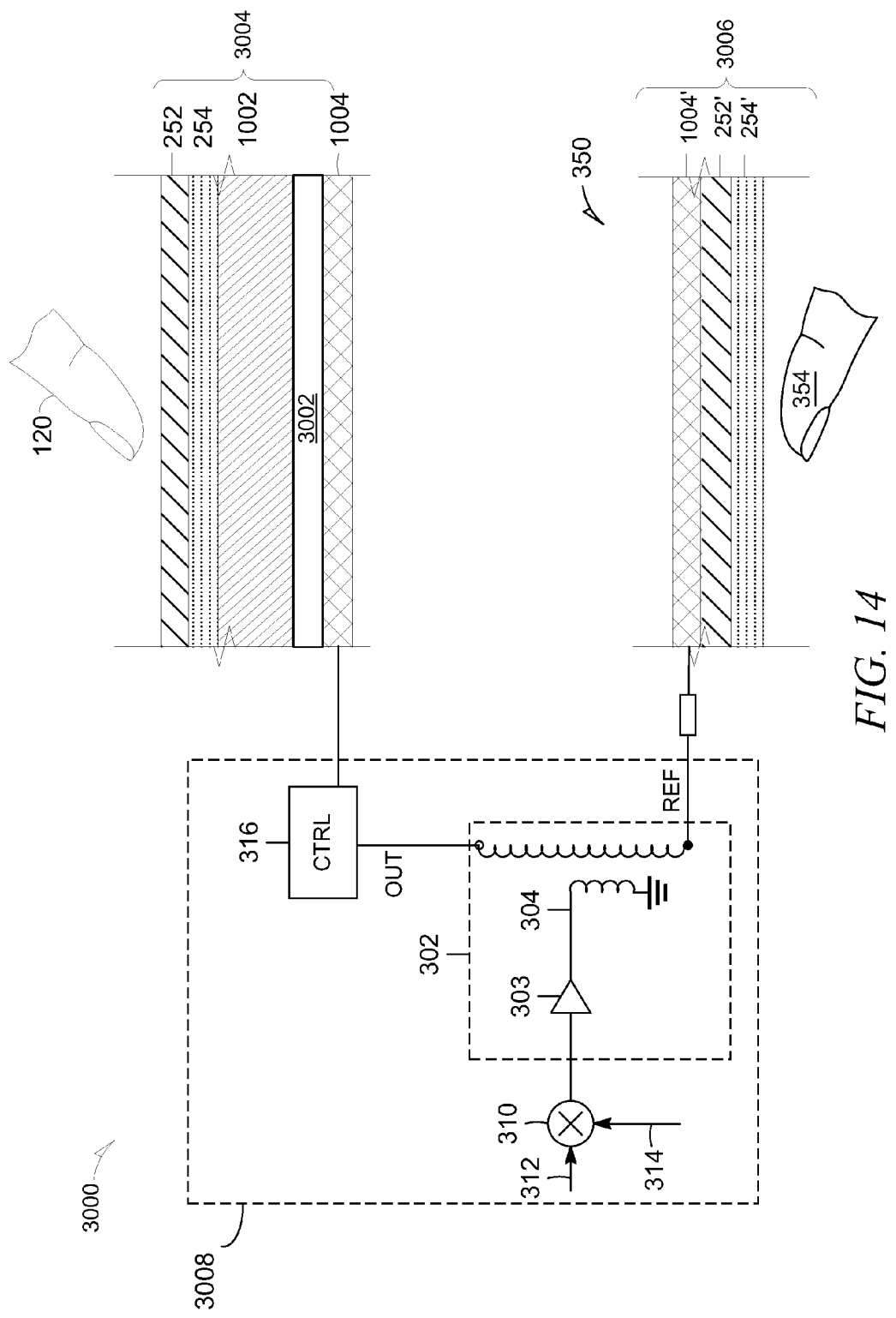
FIG. 14 is a diagram depicting another embodiment of composite sections that comprise a tactile stimulation apparatus, where one of the composite sections is provided in a grounding connection.

FIG. 14 is a diagram depicting another embodiment of composite sections that comprise a tactile stimulation apparatus 3000, where one of the composite sections is provided in a grounding connection. As depicted, the tactile stimulation apparatus 3000 includes two different composite sections 3004 and 3006 that are connected to circuitry 3008. In one embodiment, the composite section 3004 is a touch screen panel while composite section 3006 is a grounding connection 350.

The composite section 3004 includes a conductive region 1004, an electronics region 3002 disposed above the conductive region 1004, an insulation region 1002 disposed above the electronics region 3002, a semiconducting region 254 disposed above the insulation region 1002, and another insulation region 252 disposed above the semiconducting region 254. The electronics region 3002 includes various electronics or components of the tactile stimulation apparatus 3000, such as a liquid crystal display, input devices, or other electronics. A surface of the insulation region 252 is configured to be touched by body member 120.

The circuitry 3008, in this embodiment, includes a voltage amplifier 302, which is implemented as a current amplifier 303 followed by a voltage transformer 304. The secondary winding of the voltage transformer 304 is in, for example, a flying configuration with respect to the remainder of the tactile stimulation apparatus 3000. The amplifiers 302 and 303 are driven with a modulated signal whose components as inputted in a modulator 310 are denoted by 312 and 314. The output of the voltage amplifier 302 is coupled to a controller 316 and in turn, to the conductive region 1004. In the depicted embodiment, a grounding connection 350 is included in the tactile stimulation apparatus 3000, and this grounding connection 350 helps to bring a user closer to a well-defined (non-floating) potential with respect to the voltage section of the tactile stimulation apparatus 3000. The grounding connection 350 connects a reference point REF of the voltage section to a body member 354, which is different from the body member 120 to be stimulated. The reference point REF is at one end of the secondary winding of the transformer 304, while the drive voltage for the composite section 3004, which comprises an electrode, is obtained from the opposite end of the secondary winding. In another embodiment, a resistor (not shown) can be added between the composite section 3004 and the circuitry 3008 or between the composite section 3006 and the circuitry 3008 to cause a phase difference.

In an illustrative embodiment, the tactile stimulation apparatus 3000 is a hand-held apparatus, which comprises a touch screen panel activated by body member 120. The grounding connection 350 terminates at the composite section 3006, which serves as a grounding electrode and can form a surface of the tactile stimulation apparatus 3000. The composite section 3006 can be comprised of different materials. In one embodiment, as depicted in FIG. 14, the composite section 3006 comprises a semiconducting region 254', an insulation region 252', and a conductive region 1004'. The insulation region 252' is disposed between the conductive region 1004' and the semiconducting region 254'. The thickness ranges of the regions 252', 254', and 1004' may be similar to the thickness ranges of regions 252, 254, and 1004, respectively. In one embodiment, a conventional tactile display device (e.g., smart phone and touch pad) can be retrofitted to provide electrosensory sensations to body member 120. In one example, the regions 1002, 3002, 1004, and 1004' are part of the conventional tactile display device. Regions 252, 254, 252', 254' and 3008 may be added to the conventional tactile display device to form the tactile stimulation apparatus 3000, which provides electrosensory sensations to body member 120. The addition of regions 252, 254, 252', 254' to the conventional tactile display device is to galvancially isolate and float the conventional tactile display device. The circuitry 3008 provides the electrosensory sensations by driving the tactile stimulation apparatus 3000 as a whole (its local ground potential) with stimulus signal from the controller 316.

Particularly, the semiconducting region 254' has a surface that is configured to be touched by body member 354. The conductive region 1004' is connected to a voltage source at the reference point REF. In another embodiment, the composite section 3006 may comprise two semiconducting regions (not shown) and an insulation region (not shown) disposed between the two semiconducting regions. Here, one semiconducting region has a surface that is configured to be touched by the body member 354 while the other semiconducting region is connected to the voltage source at, for example, the reference point REF depicted in FIG. 14. In yet another embodiment, the composite section 3006 may comprise a semiconducting region (not shown) that is proximate to an insulating region (not shown). Here, the insulating region has a surface that is configured to be touched by the body member 354 while the semiconducting region is connected to a voltage source at the reference point REF. In still another embodiment, the composite section 3006 may comprise two conductive regions (not shown) and an insulation region (not shown) disposed between the two conductive regions.

The various embodiments of the composite sections 3006 discussed above may further suppress or prevent electrical shocks to the body member 354 because a semiconducting region of the different composite sections 3006 (e.g., semiconducting region 254') may possibly limit the amount current flow. Furthermore, the insulation region 252' insulates the conductive region 1004' (or another semiconducting region) against galvanic contact by the body member 354. The use of the various composite sections 3006 discussed in FIG. 14 may also possibly enhance the sensation of touch, pressure, or vibration from the body member 120 touching the composite section 3004 of the tactile stimulation apparatus 3000.

Figure 15:
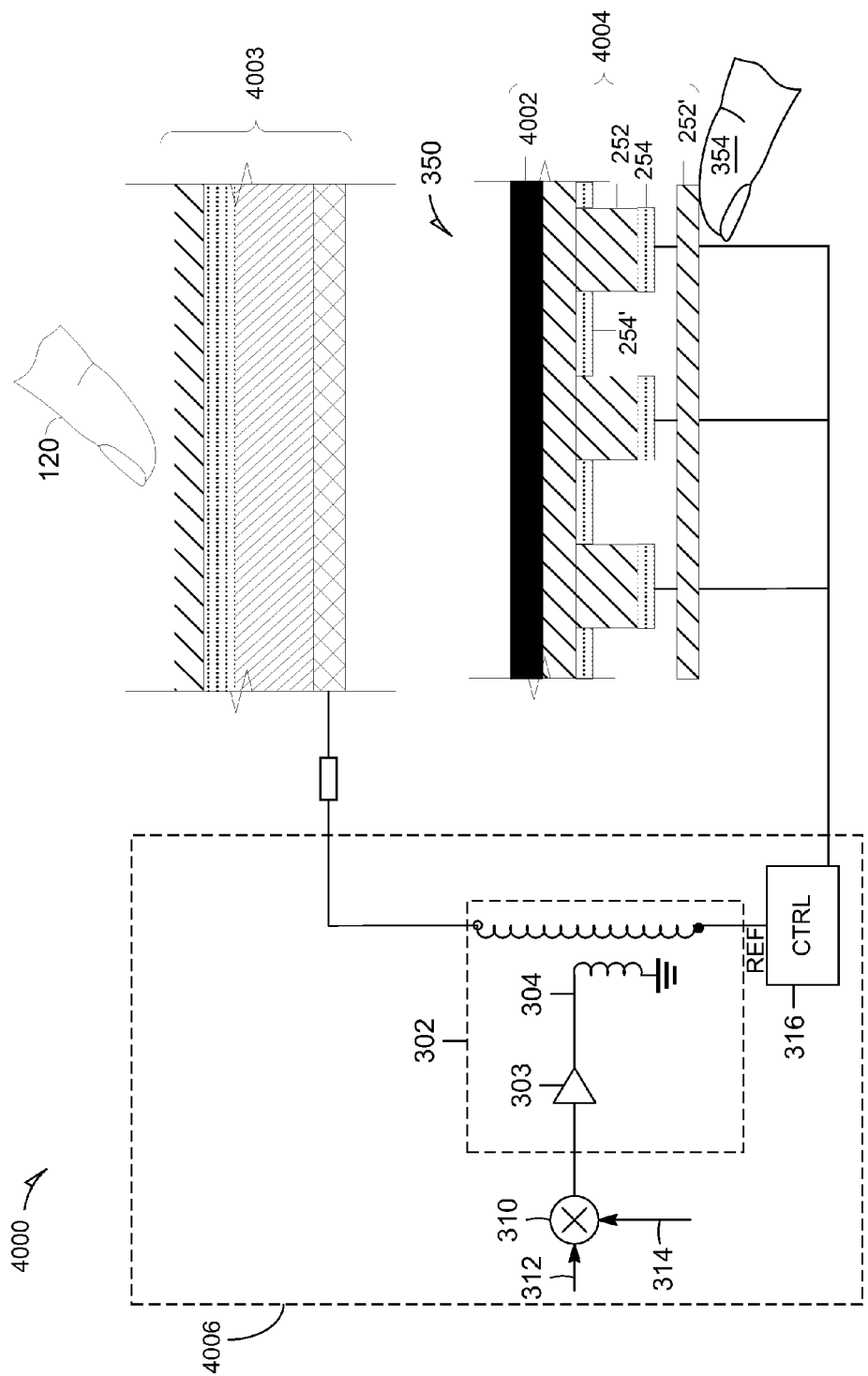
FIG. 15 is a diagram depicting a different embodiment of a composite section that is provided in a grounding connection.

FIG. 15 is a diagram depicting a different embodiment of a composite section that is provided in a grounding connection. The tactile stimulation apparatus 4000 includes two different composite sections 4003 and 4004 that are connected to circuitry 4006. The composite section 4003 may, for example, be a touch screen panel, and the composite section 4003 can have a variety of different compositions, some of which are discussed above. The other composite section 4004 is a grounding connection 350.

In this embodiment, the circuitry 4006 also includes a voltage amplifier 302, which is implemented as a current amplifier 303 followed by a voltage transformer 304. The secondary winding of the voltage transformer 304 is in, for example, a flying configuration with respect to the remainder of the tactile stimulation apparatus 4000. The amplifiers 302 and 303 are driven with a modulated signal whose components 312 and 314 as inputted in a modulator 310. The output of the voltage amplifier 302 is coupled to a controller 316, and unlike the circuitries discussed above, this controller 316 is connected to the grounding connection 350. In this alternative embodiment, the grounding connection 350 connects a reference point REF of the voltage section to a body member 354, which is different from the body member 120 to be stimulated. The reference point REF is at one end of the secondary winding of the transformer 304, while the drive voltage for the composite section 4003, which comprises an electrode, is obtained from the opposite end of the secondary winding, as depicted in FIG. 15.

As depicted in FIG. 15, the composite section 4004 includes a ground region 4002, and proximate to this ground region is an insulation region 252 having multiple grooves. In one particular embodiment, each groove is a narrow, rectangular channel cut into the insulation region 252. In the depicted embodiment, semiconducting regions 254 and 254' are overlaid over the insulation region 252, which includes the grooves. For example, the semiconducting regions 254 and 254' may be comprised of strips of semiconducting material overlaid within and outside the grooves. The composite section 4004 additionally comprises another insulation region 252' proximate to the semiconducting regions 254 and 254' and having a surface that is configured to be touched by body member 354. In an alternate embodiment, conductive regions may be overlaid over the insulation region 252 instead of the semiconducting regions 254 and 254'.

Here, the outermost semiconducting regions 254 (or portions of semiconducting regions 254 outside of the grooves) are connected to the controller 316, thereby creating a galvanic coupling between the reference point REF and the non-stimulated body member 354. The portions of the semiconducting regions 254' within the grooves are capacitively coupled to ground (or ground region 4002 behind the insulation region 252). It should be appreciated that the outermost semiconducting regions 254 are also capacitively coupled to ground, but because they are further away from the ground when compared to the semiconducting regions 254' within the grooves, the capacitive coupling of the semiconducting regions 254' to ground is stronger than the capacitive coupling of the semiconducting regions 254 to ground.

The use of the various composite sections 4004 discussed in FIG. 15 may possibly improve grounding when compared to, for example, a non-composite surface. Furthermore, the composite section 4004 may also possibly enhance the sensation of touch, pressure, or vibration from the body member 120 touching the composite section 4003 of the tactile stimulation apparatus 4000.

Figure 16:
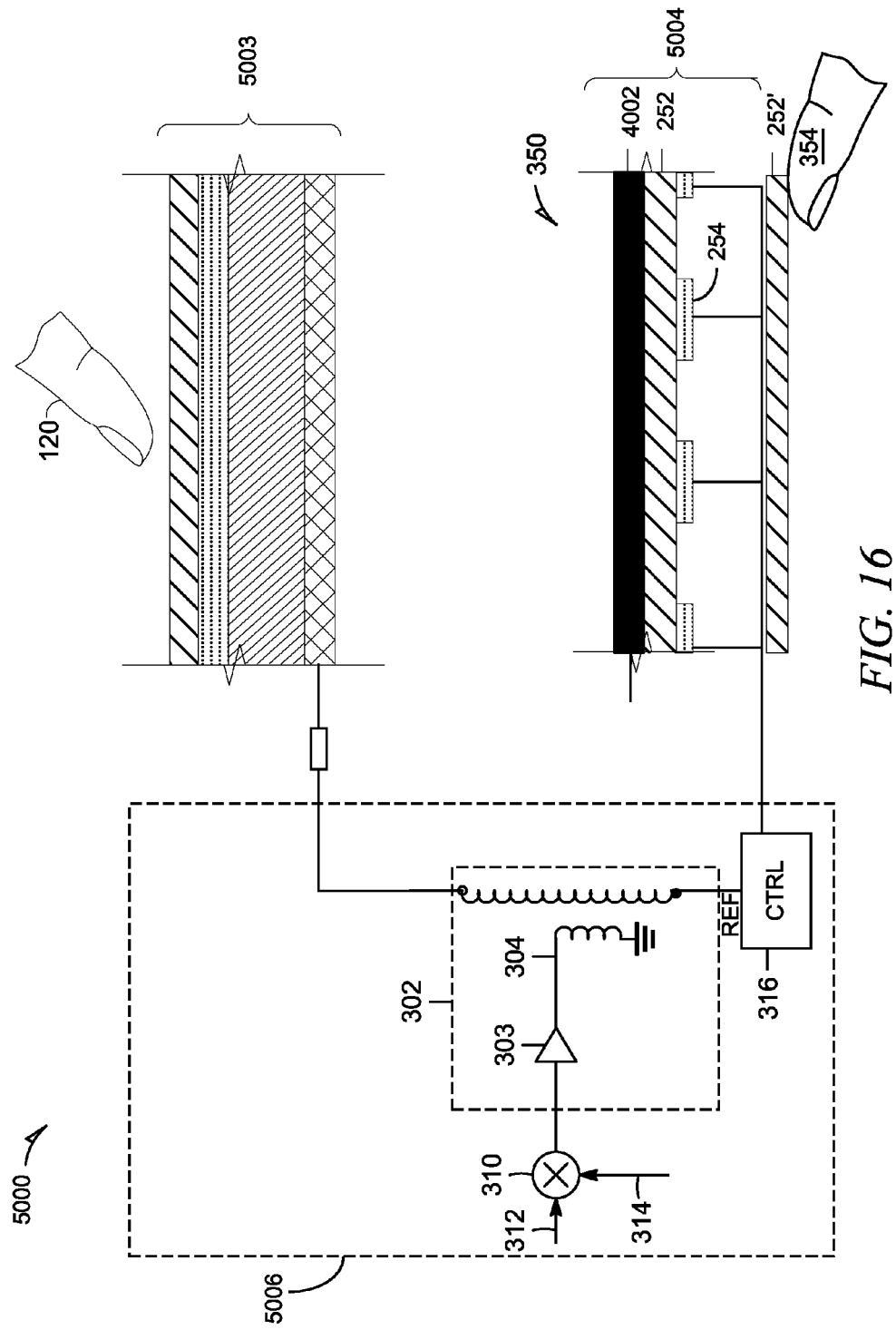
FIG. 16 is a diagram depicting a yet another embodiment of a composite section that is provided in a grounding connection.

FIG. 16 is a diagram depicting yet another embodiment of a composite section that is provided in a grounding connection. This embodiment of a tactile stimulation apparatus 5000 includes two different composite sections 5003 and 5004 that are connected to circuitry 5006. The composite section 5003 may, for example, be a touch screen panel, and the composite section 5003 can have a variety of different compositions, some of which are discussed above. The other composite section 5004 is a grounding connection 350.

In this embodiment, the circuitry 5006 also includes a voltage amplifier 302, which is implemented as a current amplifier 303 followed by a voltage transformer 304 that is in a floating configuration. The secondary winding of the voltage transformer 304 is in, for example, a flying configuration with respect to the remainder of the tactile stimulation apparatus 5000. The amplifiers 302 and 303 are driven with a modulated signal whose components 312 and 314 as inputted in a modulator 310. The output of the voltage amplifier 302 is coupled to a controller 316, which is connected to the grounding connection 350. In this alternative embodiment, the grounding connection 350 connects a reference point REF of the voltage section to a body member 354, which is different from the body member 120 to be stimulated. The reference point REF is at one end of the secondary winding of the transformer 304, while the drive voltage for the composite section 5003, which comprises an electrode, is obtained from the opposite end of the secondary winding, as depicted in FIG. 16.

As depicted in FIG. 16, the composite section 5004 includes a ground region 4002, and proximate to this ground region is an insulation region 252. Overlaid over the insulation region 252 are multiple semiconducting regions 254. For example, the semiconducting regions 254 may be comprised of strips of semiconducting material overlaid over the insulation region 252. The composite section 5004 additionally comprises another insulation region 252' proximate to the semiconducting regions 254 and has a surface that is configured to be touched by body member 354. This insulation region 252' may be loosely coupled to the semiconducting regions 254. In an alternate embodiment, conductive regions may be overlaid over the insulation region 252 instead of the semiconducting regions 254.

In this embodiment, the semiconducting regions 254 are connected to the controller 316. When the circuitry 5006 applies voltage to composite section 5003, the insulation region 252' may vibrate because the voltage shrinks the insulation region 252'. Without the voltage, the insulation region 252' returns to its original shape. When the voltage is pulsating, the shrinkage and expansion cause the insulation region 252' to vibrate. This vibration of the insulation region 252' may possibly enhance the sensation of touch, pressure, or vibration from the body member 120 touching the composite section 5003 of the tactile stimulation apparatus 5000. It should be noted that vibration may also be caused by body member 120 having a different polarity. Here, if sufficiently high voltage is applied to the semiconducting region 254, then the person with body members 120 and 354 acts as a ground potential, thereby letting an electromagnetic field generated by the voltage to vibrate the insulation region 252'.

Figure 17A:
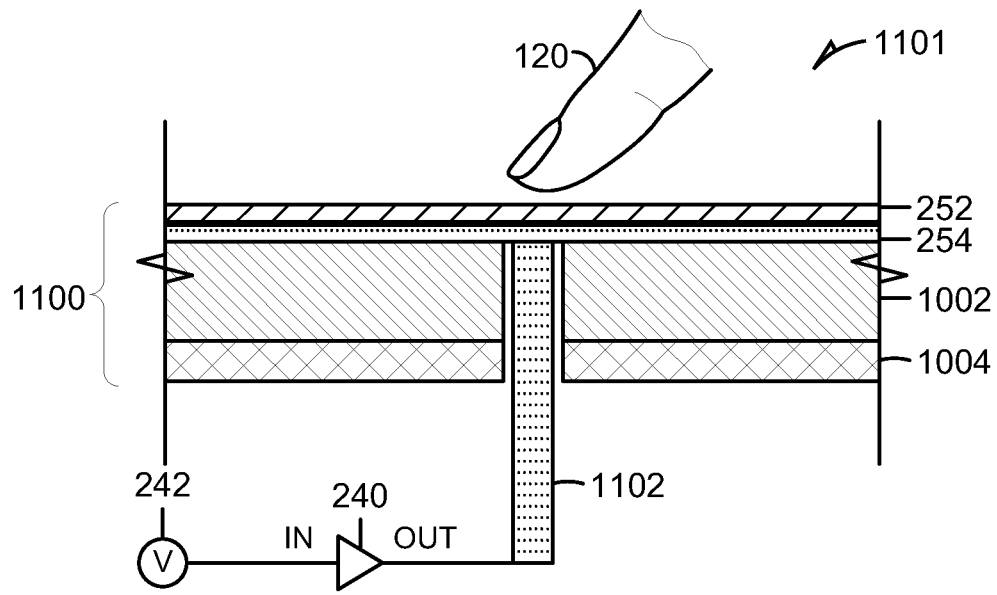
FIGS. 17A and 17B are diagrams depicting a tactile stimulation apparatus having a connector that connects a semiconducting region of a touch screen panel to a voltage source, in accordance with an example embodiment.
Figure 17B:
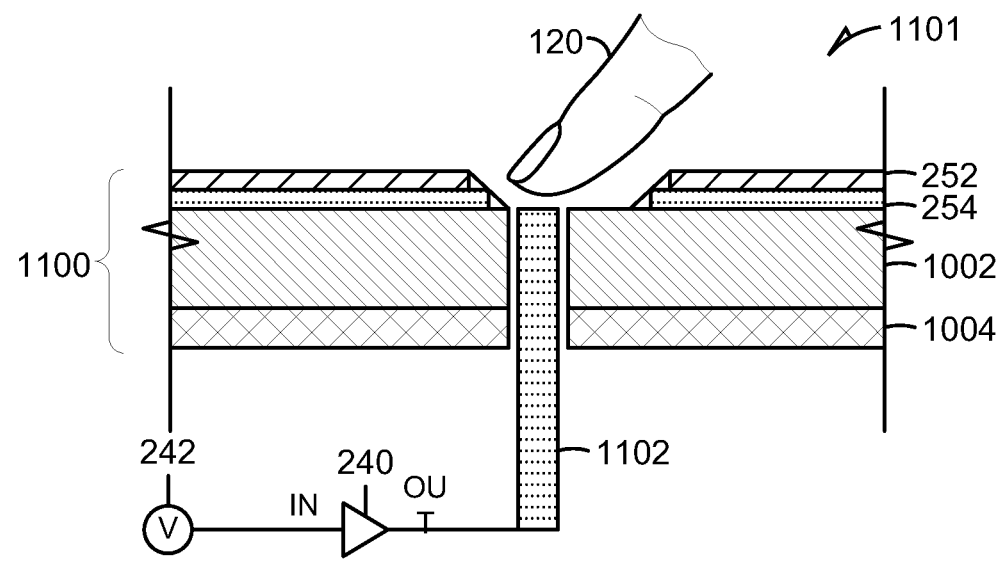

FIGS. 17A and 17B are diagrams depicting a tactile stimulation apparatus 1101 having a connector that connects a semiconducting region of a touch screen panel 1100 to a voltage source 242, in accordance with an example embodiment. As depicted in FIG. 17A, this embodiment of the touch screen panel 1100 includes a conductive region 1004, an insulation region 1002 disposed above the conductive region 1004, a semiconducting region 254 disposed above the insulation region 1002, and another insulation region 252 disposed above the semiconducting region 254. The tactile stimulation apparatus 1101 also includes a voltage source 242 and a voltage amplifier 240 coupled to the semiconducting region 254 by way of a connector 1102. Here, the insulation region 1002 and conductive region 1004 may have a small hole to accommodate the connector 1102.

In this example, the voltage source 242 is configured to charge the semiconducting region 254, which functions as an electrode, to an electric potential, thereby producing an electrosensory sensation on the body member 120. The voltage source 242 applies this charge by way of the connector 1102 that physically couples the semiconducting region 254 to the voltage source 242. In this embodiment, the connector 1102 also comprises a semiconducting material, which may suppress or prevent electrical shocks to the body member 120 in the event of a breakdown of both the semiconducting region 254 and the insulation region 252, thereby exposing the connector 1102.

For example, as depicted in FIG. 17B, an area of both the semiconducting region 254 and the insulation region 252 may be worn out or broken down such that the connector 1102 is exposed to be touched by the body member 120. As a result, at this particular area, the semiconducting region 254 and the insulation region 252 do not serve to separate or insulate the body member 120 from the circuit comprising at least the voltage amplifier 240 and voltage source 242. In one embodiment, the connector 1102 may also comprise a semiconducting material to suppress or prevent the electrical shock to the body member 120, based on principles discussed above, in the event that the body member 120 touches the exposed connector 1102.

Figure 18:
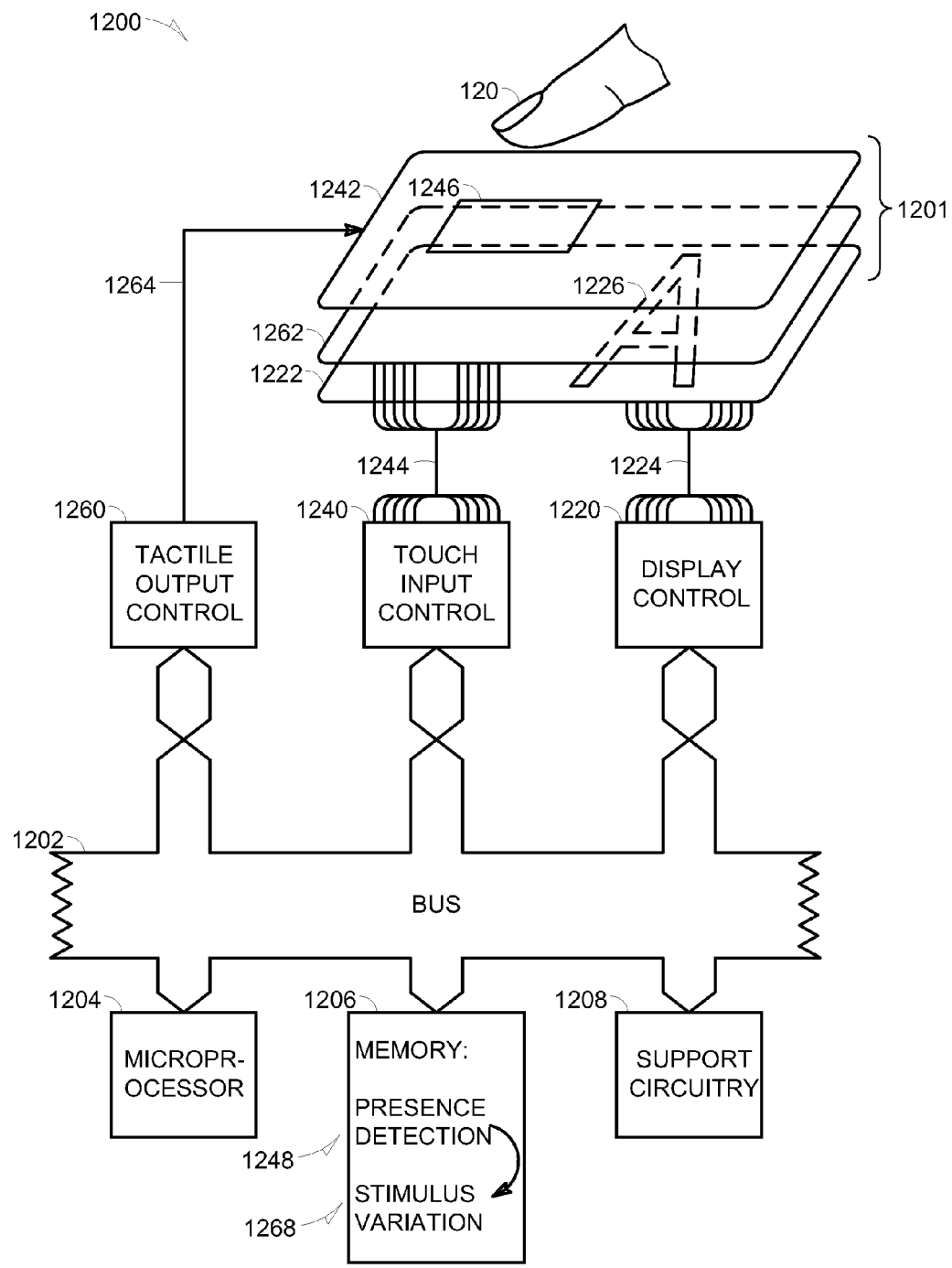
FIG. 18 is a schematic diagram depicting various elements of a tactile stimulation apparatus, in accordance with an example embodiment.

FIG. 18 is a schematic diagram depicting various elements of a tactile stimulation apparatus 1200, in accordance with an example embodiment. This tactile stimulation apparatus 1200 comprises a bus 1202 providing inter-component connections between microprocessor 1204, memory 1206, processor support circuitry 1208, display controller 1220, tactile output controller 1260, and touch input controller 1240. The display controller 1220 controls the display region 1222 of a touch screen panel 1201, such as a liquid-crystal display, by way of an array of connecting wires 1224. Similarly, the touch input controller 1240 controls a touch-sensitive region 1262 by way of an array of connecting wires 1244.

The tactile stimulation apparatus 1200 also comprises a tactile output section, which comprises a tactile output controller 1260 and tactile output region 1242, which includes at least one semiconducting region as discussed above, interconnected by an interconnection wire 1264. In the embodiment depicted in FIG. 18, the touch screen panel 1201 is an integration of the tactile output region 1242 with a substantially known touch-sensitive display, including the display region 1222 and the touch-sensitive region 1262. For details of the tactile output controller 1260 and the touch-sensitive region 1262, a reference is made to the previously described embodiments.

As depicted in FIG. 18, the display region 1222 shows information 1226, which is seen by the user through the touch-sensitive region 1262 and the tactile output region 1242. The touch-sensitive region 1262 is scanned by the touch input controller 1240, such that the microprocessor 1204, under control of software stored in and executed from the memory 1206, is aware of the presence or absence of the body member 120 on top of a predefined area 1246. The composite section of the touch-sensitive region 1262 may be completely homogenous, and the predefined areas, such as area 1246, are created dynamically by the microprocessor 1204, under control of the software, such that the X and Y coordinates of the body member 120, as it touches the touch-sensitive region 1262, are compared with predefined borders of the predefined area 1246.

Reference numeral 1248 denotes a presence-detection logic stored within the memory 1206. Execution of the presence-detection logic 1248 by the microprocessor 1204 causes the detection of the presence or absence of the body member 120 at the predefined area 1246. A visual cue, such as a name of the function or activity associated with the predefined area 1246, is typically displayed by the display region 1222, as part of the displayed information 1226, so as to help the user find the predefined area 1246.

Additionally stored within the memory 1206 is a stimulus-variation logic 1268. Input information to the stimulus-variation logic 1268 includes information on the presence or absence of the body member 120 at the predefined area 1246. Based on this presence information, the stimulus-variation logic 1268 has the effect that the microprocessor 1204 instructs the tactile output controller 1260 to vary the electrical input to the tactile output region 1242, thus varying the electrosensory sensations caused to the body member 120. Thus, a user may detect the presence or absence of the displayed information at the predefined area 1246 merely by way of tactile information (or electrosensory sensation), that is, without requiring visual clues.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, the invention may lie in less than all features of a single disclosed embodiment. Thus, the following claims are hereby incorporated into the detailed description, with each claim standing on its own as a separate preferred embodiment.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements fall within the scope of the invention(s).

What is claimed is:

1. A tactile display device comprising:
a touch screen panel comprising an insulation region and a semiconducting region proximate to the insulation region, the insulation region configured to be touched by a body member, the semiconducting region configured to be charged to an electric potential that produces an electrosensory sensation on the body member; and
a voltage source proximate to the semiconducting region, the voltage source configured to charge the semiconducting region to the electric potential producing the electrosensory sensation on the body member, the semiconducting region being chargeable by the voltage source to the electric potential that produces the electrosensory sensation on the body member in less than 500 milliseconds.

2. The tactile display device of claim 1, wherein the insulation region comprises glass.

3. The tactile display device of claim 1, wherein the semiconducting region comprises a semiconductive transparent polymer.

4. The tactile display device of claim 1, wherein the insulation region and the semiconducting region comprise a single piece of insulation material, and wherein a portion of the insulation material is added with a dopant to change the portion of the insulation material to a semiconducting material, the portion being the semiconducting region.

5. The tactile display device of claim 4, wherein the dopant is a plurality of carbon nanotubes.

6. The tactile display device of claim 1, wherein the insulation region has a surface and an opposite surface, wherein the surface is configured to be touched by the body member, and wherein a layer of a semiconducting material is spread over the opposite surface, the layer being the semiconducting region.

7. The tactile display device of claim 1, wherein the insulation region prevents a flow of direct current from the semiconducting region to the body member and a capacitive coupling over the insulation region is formed between the semiconducting region and the body member as a result of the electric potential, wherein the capacitive coupling caused by the electric potential produces the electrosensory sensation on the body member.

8. The tactile display device of claim 1, further comprising a connector connecting the semiconducting region to the voltage source, the connector comprising a semiconducting material.

9. The tactile display device of claim 1, wherein the insulation region comprises a first piece of insulation material and the semiconducting region comprises a second piece of semiconducting material, and wherein the first piece is physically distinct from and is adhered to the second piece.

10. The tactile display device of claim 1, wherein the insulation region and the semiconducting region comprise a single piece of semiconducting material, and wherein a portion of the semiconducting material is added with a dopant to change the portion of the semiconducting material to an insulation material, the portion being the insulation region.

11. The tactile display device of claim 1, wherein the semiconducting region is an electrode.

12. The tactile display device of claim 1, wherein the semiconducting region limits flow of current to the body member to suppress an electrical shock to the body member.

13. The tactile display device of claim 1, wherein the voltage source is not physically connected to the semiconducting region, and wherein the voltage source generates an electric field that charges the semiconducting region to the electric potential.

14. The tactile display device of claim 1, wherein the voltage source is configured to charge the semiconducting region to an electric potential in less than 200 milliseconds.

15. The tactile display device of claim 1, further comprising a different composite section configured to be touched by a different body member, wherein the different composite section is connected to the voltage source and is a grounding connection that decreases a potential difference between a reference potential of the tactile stimulation apparatus and the different body member.

16. The tactile display device of claim 15, wherein the different composite section comprises a conductive region, a different semiconducting region, and a different insulation region disposed between the conductive region and the different semiconducting region, wherein the different semiconducting region has a surface that is configured to be touched by the different body member, and wherein the conductive region is connected to the voltage source.

17. The tactile display device of claim 15, wherein the different composite section comprises a first semiconducting region, a second semiconducting region, and a different insulation region disposed between the first and second semiconducting regions, wherein the first semiconducting region has a surface that is configured to be touched by the different body member, and wherein the second semiconducting region is connected to the voltage source.

18. The tactile display device of claim 15, wherein the different composite section comprises a different semiconducting region and a different insulation region proximate to the different semiconducting region, wherein the different insulation region has a surface that is configured to be touched by the different body member, and wherein the different semiconducting region is connected to the voltage source.

19. The tactile display device of claim 1, wherein the touch screen panel further comprises a touch detection region configured to detect a touch by the body member, and the semiconducting region is configured to function as an insulator of the touch detection region.

20. The tactile display device of claim 19, wherein the touch detection region is configured to operate at levels of voltage and electrical current at which the semiconducting region functions as the insulator of the touch detection region; and the semiconducting region is configured to operate at levels of voltage and electrical current at which the semiconducting region functions as a conductor that is chargeable to the electric potential.

* * * * *